United States Patent
Fang et al.

(10) Patent No.: US 11,551,939 B2
(45) Date of Patent: Jan. 10, 2023

(54) SUBSTRATE COMPRISING INTERCONNECTS EMBEDDED IN A SOLDER RESIST LAYER

(71) Applicant: QUALCOMM Incorporated, San Diego, CA (US)

(72) Inventors: Kun Fang, San Diego, CA (US); Jaehyun Yeon, San Diego, CA (US); Suhyung Hwang, Rancho Mission Viejo, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 3 days.

(21) Appl. No.: 17/010,693

(22) Filed: Sep. 2, 2020

(65) Prior Publication Data
US 2022/0068662 A1    Mar. 3, 2022

(51) Int. Cl.
*H01L 21/48* (2006.01)
*H01L 23/498* (2006.01)
*H01L 23/00* (2006.01)

(52) U.S. Cl.
CPC ........ *H01L 21/481* (2013.01); *H01L 21/4853* (2013.01); *H01L 23/49811* (2013.01); *H01L 23/49838* (2013.01); *H01L 24/16* (2013.01); *H01L 24/17* (2013.01); *H01L 2224/16225* (2013.01); *H01L 2224/1703* (2013.01); *H01L 2224/17135* (2013.01)

(58) Field of Classification Search
CPC .............. H01L 21/481; H01L 21/4853; H01L 23/49811; H01L 23/49838; H01L 24/16; H01L 24/17; H01L 2224/16225; H01L 2224/1703; H01L 2224/17135

USPC ........................................................ 257/737
See application file for complete search history.

(56) References Cited

U.S. PATENT DOCUMENTS 7,402,901 B2   7/2008  Hatano et al.
8,736,074 B2   5/2014  Iguchi et al.
(Continued)

FOREIGN PATENT DOCUMENTS

WO    2014188945 A1   11/2014
WO    2014199890 A1   12/2014

OTHER PUBLICATIONS

International Search Report and Written Opinion—PCT/US2021/045407—ISA/EPO—dated Dec. 1, 2021.

*Primary Examiner* — Thao X Le
*Assistant Examiner* — Laura M Dykes
(74) *Attorney, Agent, or Firm* — Loza & Loza, LLP

(57) ABSTRACT

A substrate that includes a core layer comprising a first surface and a second surface, at least one first dielectric layer located over a first surface of the core layer, at least one second dielectric layer located over a second surface of the core layer, high-density interconnects located over a surface of the at least one second dielectric layer, interconnects located over the surface of the at least one second dielectric layer, and a solder resist layer located over the surface of the at least one second dielectric layer. A first portion of the solder resist layer that is touching the high-density interconnects includes a first thickness that is equal or less than a thickness of the high-density interconnects. A second portion of the solder resist layer that is touching the interconnects includes a second thickness that is greater than a thickness of the interconnects.

20 Claims, 16 Drawing Sheets

(56) References Cited

U.S. PATENT DOCUMENTS

| | | |
|---|---|---|
| 9,431,371 B2 | 8/2016 | Karikalan et al. |
| 10,446,520 B2 | 10/2019 | Jeng et al. |
| 2009/0027864 A1 | 1/2009 | Cho et al. |
| 2013/0300004 A1* | 11/2013 | Choi .................. H01L 23/3128 257/796 |
| 2014/0090877 A1* | 4/2014 | Takagi .............. H01L 23/49827 174/255 |
| 2015/0216059 A1* | 7/2015 | Hayashi ............... H05K 3/4688 174/251 |
| 2015/0255411 A1 | 9/2015 | Karhade et al. |
| 2016/0095216 A1* | 3/2016 | Nagai .................... H05K 1/111 174/250 |
| 2016/0174379 A1* | 6/2016 | Shimizu ................ H05K 1/181 361/760 |
| 2017/0033065 A1* | 2/2017 | Chang .................. H01L 21/561 |
| 2017/0170105 A1* | 6/2017 | Yao .................... H01L 21/4853 |

* cited by examiner

PROFILE VIEW

BOTTOM PLAN VIEW

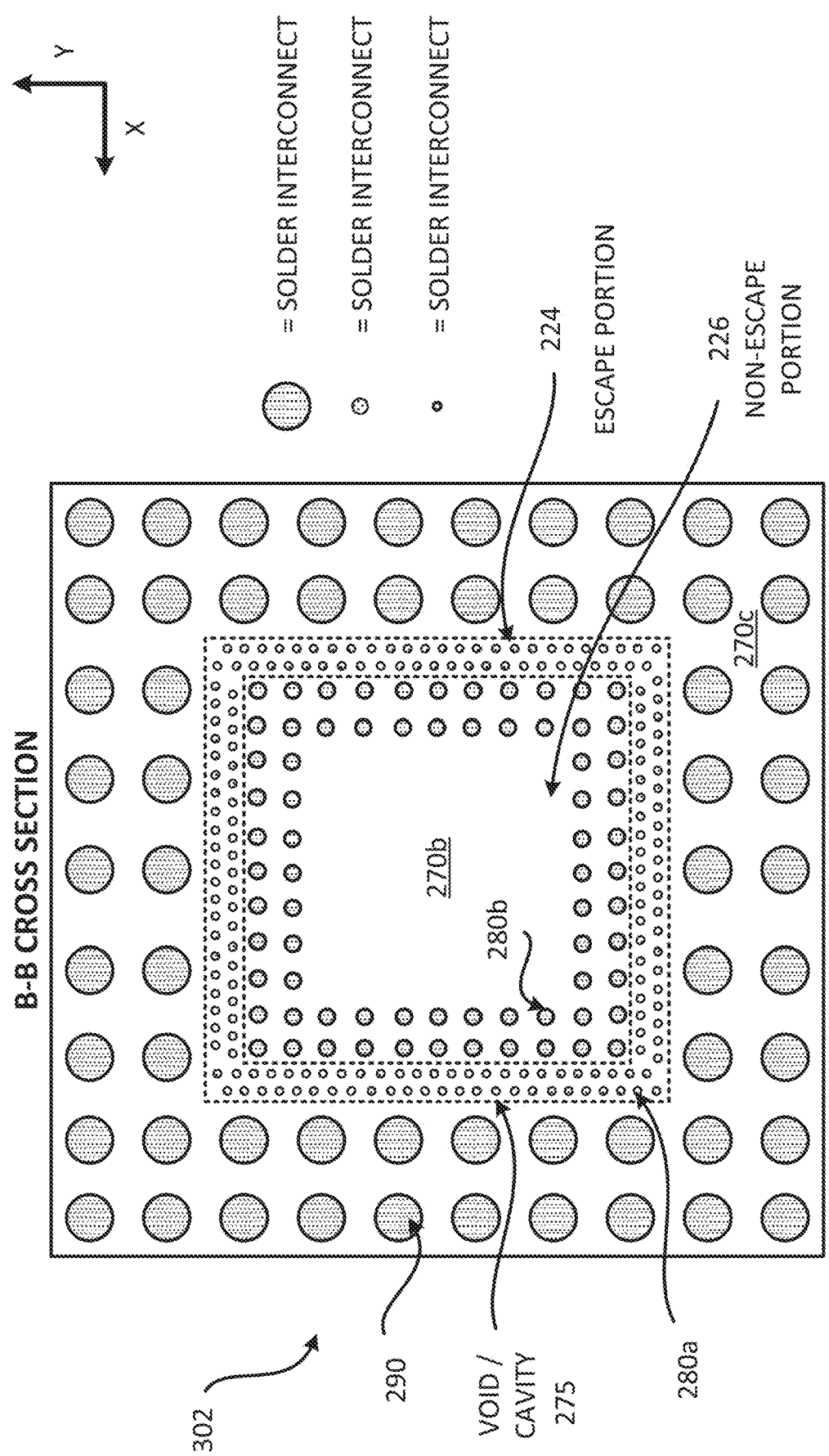

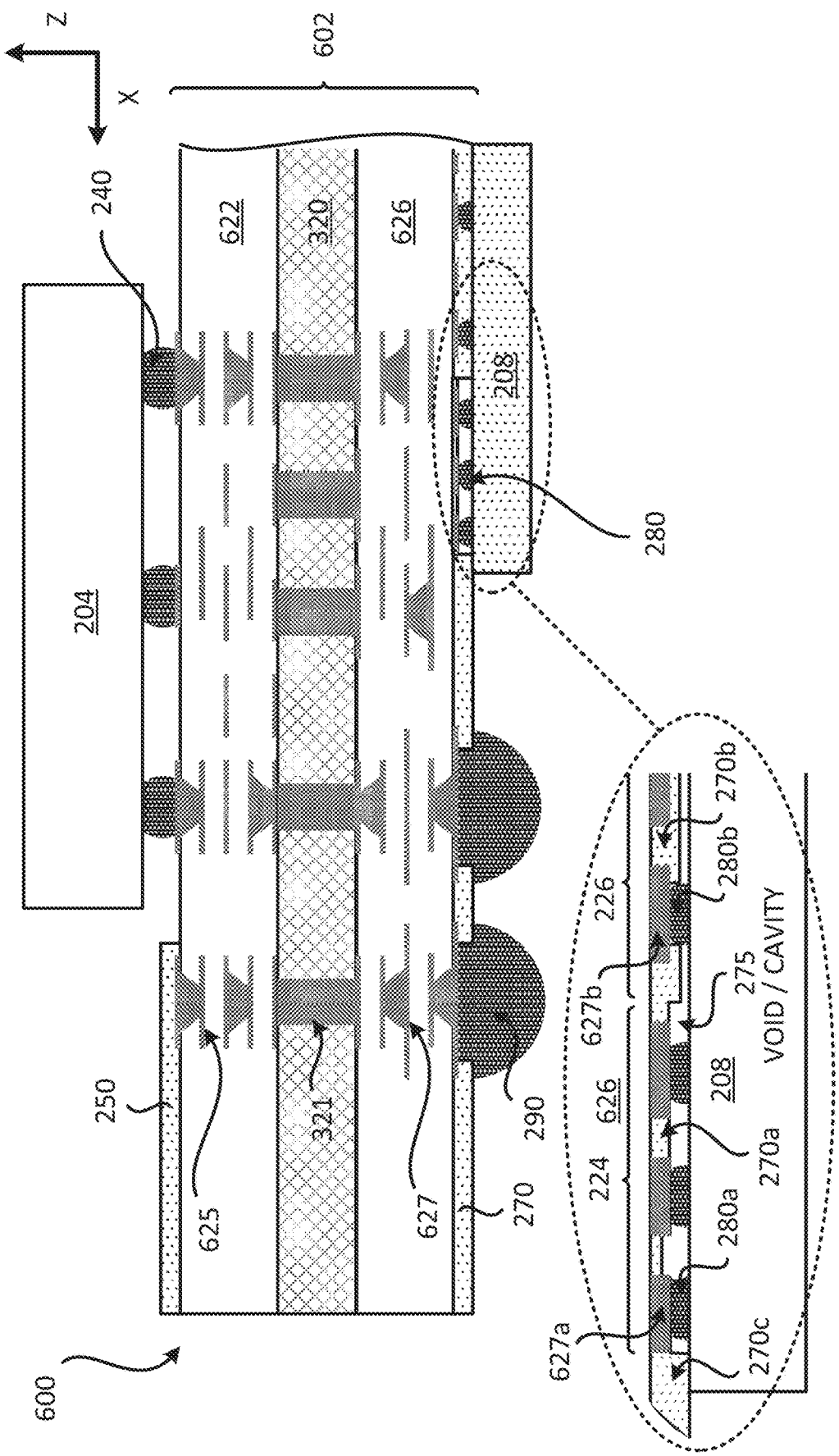

SUBSTRATE COMPRISING INTERCONNECTS EMBEDDED IN A SOLDER RESIST LAYER

FIELD

Various features relate to substrates, and more specifically to a substrate that includes a high density interconnects.

BACKGROUND

FIG. 1 illustrates a package 100 that includes a substrate 102, an integrated device 104 and an integrated device 106. The substrate 102 includes at least one dielectric layer 120, a plurality of interconnects 122 and a plurality of solder interconnects 124. A plurality of solder interconnects 144 is coupled to the substrate 102 and the integrated device 104. A plurality of solder interconnects 164 is coupled to the substrate 102 and the integrated device 106. Fabricating a substrate that includes high-density interconnects can be expensive. There is an ongoing need to provide a low-cost substrate that includes high-density interconnects.

SUMMARY

Various features relate to substrates, and more specifically to a substrate that includes a high density interconnects.

One example provides a substrate that includes a core layer comprising a first surface and a second surface, at least one first dielectric layer located over a first surface of the core layer, at least one second dielectric layer located over a second surface of the core layer, a plurality of first interconnects located over a surface of the at least one second dielectric layer, a plurality of second interconnects located over the surface of the at least one second dielectric layer, and a solder resist layer located over the surface of the at least one second dielectric layer. The plurality of second interconnects is co-planar to the plurality of first interconnects. The solder resist layer includes a first thickness and a second thickness. A first portion of the solder resist layer that is touching the plurality of first interconnects includes the first thickness that is equal or less than a thickness of the plurality of first interconnects. A second portion of the solder resist layer that is touching the plurality of second interconnects includes the second thickness that is greater than a thickness of the plurality of second interconnects.

Another example provides an apparatus that includes a substrate and an integrated device coupled to the substrate. The substrate includes a core layer comprising a first surface and a second surface, at least one first dielectric layer located over a first surface of the core layer, at least one second dielectric layer located over a second surface of the core layer, means for high-density interconnection located over a surface of the at least one second dielectric layer, means for interconnection located over the surface of the at least one second dielectric layer, and a solder resist layer located over the surface of the at least one second dielectric layer. The means for interconnect is co-planar to the means for high-density interconnection. The solder resist layer includes a first thickness and a second thickness. A first portion of the solder resist layer that is touching the means for high-density interconnection includes the first thickness that is equal or less than a thickness of the means for high-density interconnection. A second portion of the solder resist layer that is touching the means for interconnection includes the second thickness that is greater than a thickness of the means for interconnection. The integrated device is coupled to a surface of the substrate. The integrated device is coupled to the means for high-density interconnection and to the means for interconnection through means for solder interconnection.

Another example provides a method for fabricating a substrate. The method provides a core layer comprising a first surface and a second surface. The method forms at least one first dielectric layer over a first surface of the core layer. The method forms at least one second dielectric layer over a second surface of the core layer. The method forms a plurality of first interconnects over a surface of the at least one second dielectric layer. The method forms a plurality of second interconnects over the surface of the at least one second dielectric layer. The plurality of second interconnects and the plurality of first interconnects are located on a same metal layer. The method forms a solder resist layer located over the surface of the at least one second dielectric layer. The method removes portions of the solder resist layer such that the solder resist layer includes a first thickness and a second thickness. The first portion of the solder resist layer that is touching the plurality of first interconnects includes the first thickness that is equal or less than a thickness of the plurality of first interconnects. A second portion of the solder resist layer that is touching the plurality of second interconnects includes the second thickness that is greater than a thickness of the plurality of second interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIG. 5 illustrates a plan view of a substrate that includes high-density interconnects and interconnects embedded in the solder resist layer of the substrate.

FIG. 6 illustrates a profile view of a package that includes a substrate and an integrated device coupled to high-density interconnects and interconnects that are embedded in the solder resist layer of the substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes a core layer comprising a first surface and a second surface, at least one first dielectric layer (e.g., first prepreg layer) located over a first surface of the core layer, at least one second dielectric layer (e.g., second prepreg layer) located over a second surface of the core layer, a plurality of high-density interconnects (e.g., first interconnects) located over a surface of the at least one second dielectric layer, a plurality of interconnects (e.g., second interconnects) located over the surface of the at least one second dielectric layer, and a solder resist layer located over the surface of the at least one second dielectric layer. The plurality of interconnects is co-planar to the plurality of high-density interconnects. The solder resist layer includes a first thickness and a second thickness. A first portion of the solder resist layer that is touching the plurality of high-density interconnects includes the first thickness that is equal or less than a thickness of the plurality of high-density interconnects. A second portion of the solder resist layer that is touching the plurality of interconnects includes the second thickness that is greater than a thickness of the plurality of interconnects. An integrated device may be coupled to plurality of high-density interconnects and the plurality of interconnects of the substrate through a plurality of solder interconnects. As will be further described below, the substrate provides a low-cost substrate, a high reliability substrate with a low short risk in an escape portion. In addition, a shorter fabrication process for the substrate is provided which reduces the cost of the substrate.

Figure 1:
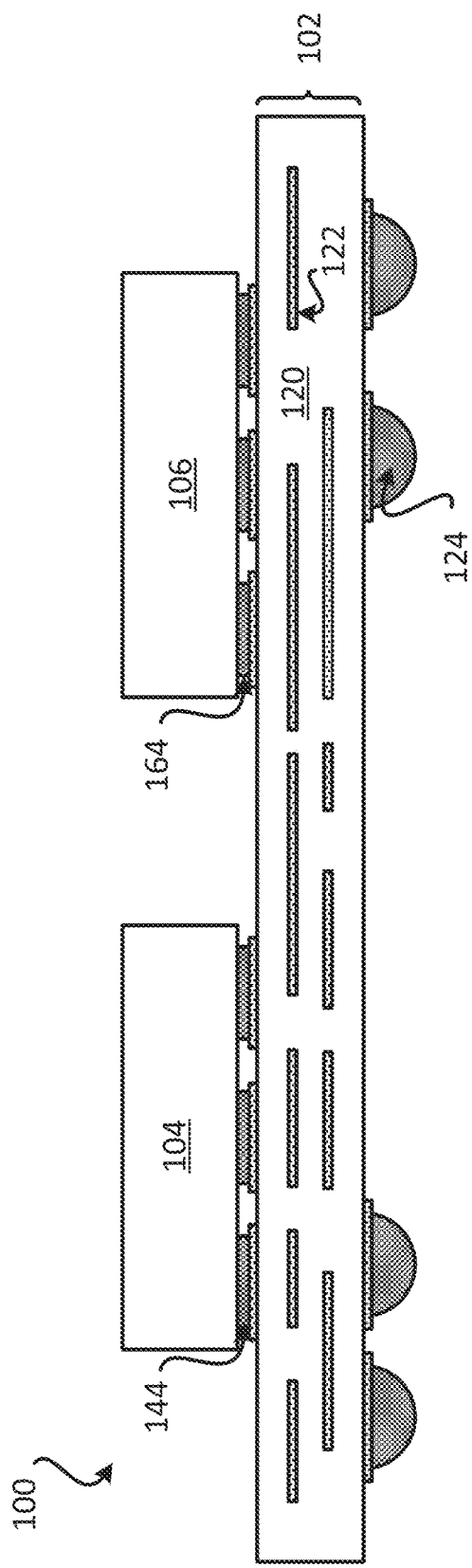
FIG. 1 illustrates a profile view of a package that includes a substrate and integrated devices coupled to a substrate.
Figure 2:
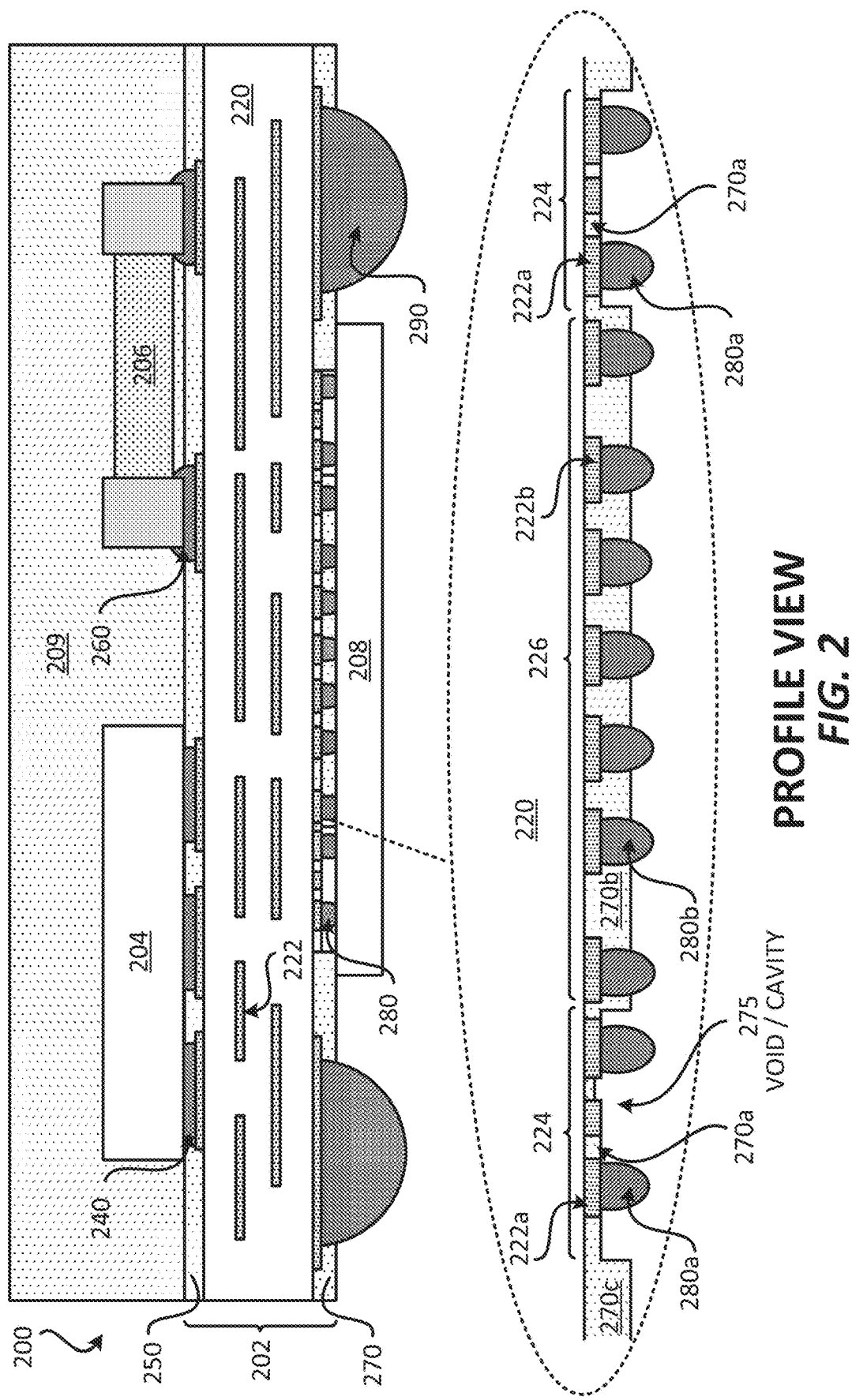
FIG. 2 illustrates a profile view of a package that includes a substrate and an integrated device coupled to high-density interconnects and interconnects that are embedded in the solder resist layer of the substrate.

Exemplary Packages that Include a Substrate Comprising High-Density Interconnects Embedded in a Solder Resist Layer FIG. 2 illustrates a profile view of a package 200 that includes an integrated device and a substrate comprising high-density interconnects embedded in a solder resist layer. The package 200 includes a substrate 202, an integrated device 204, a passive device 206, an integrated device 208 and an encapsulation layer 209. The integrated device 204 is coupled to a first surface (e.g., top surface) of the substrate 202 through a plurality of solder interconnects 240. The passive device 206 (which may be a surface mounted passive device (SMD)) is coupled to the first surface of the substrate 202 through a plurality of solder interconnects 260. An encapsulation layer 209 may be coupled to the first surface of the substrate 202. The encapsulation layer 209 may encapsulate the integrated device 204 and the passive device 206. The integrated device 208 may be coupled to a second surface (e.g., bottom surface) of the substrate 202 through a plurality of solder interconnects 280.

As shown in FIG. 2, the substrate 202 includes at least one dielectric layer 220, a plurality of interconnects 222, a solder resist layer 250 and a solder resist layer 270. The solder resist layer 250 may be located on the first surface of the substrate 202. The solder resist layer 270 may be located on second surface of the substrate 202. Some interconnects from the plurality of interconnects 222 may be embedded in the solder resist layer 270. For example, the plurality of interconnects 222 may include a plurality of high-density interconnects 222a (e.g., plurality of first interconnects) and a plurality of interconnects 222b (e.g., plurality of second interconnects). The plurality of high-density interconnects 222a and the plurality of interconnects 222b may be co-planar to each other. For example, the plurality of high-density interconnects 222a may be located on the same metal layer of the substrate 202 as the plurality of interconnects 222b. The plurality of high-density interconnects 222a and the plurality of interconnects 222b are embedded in the solder resist layer 270. The substrate 202 may include an escape portion 224 (e.g., integrated escape portion) and a non-escape portion 226. The plurality of high-density interconnects 222a may be located in the escape portion 224 of the substrate 202. An escape portion 224 of the substrate 202 is a portion of the substrate 202 that includes interconnects that are configured to be electrically coupled to solder interconnects of an integrated device and solder interconnects of the substrate 202. For example, the escape portion 224 includes interconnects that are configured to be electrically coupled to the solder interconnect 280a and at least one solder interconnect 290. Escape portions are further illustrated and described below in at least FIGS. 4 and 5.

In some implementations, the plurality of high-density interconnects 222a may have a lower minimum width and/or minimum spacing than the minimum width and/or minimum spacing of the plurality of interconnects 222b. For example, the plurality of high-density interconnects 222a may include interconnects with (i) a minimum width of 8 micrometers and (ii) a minimum spacing of 10 micrometers, and the plurality of interconnects 222b may include interconnects with (i) a minimum width of 20 micrometers and (ii) a minimum spacing of 25 micrometers. An interconnect that is not a high-density interconnect may be a low-density interconnect that has lower minimum width and/or minimum spacing than the minimum width and/or minimum spacing of a high-density interconnect.

In some implementations, the plurality of high-density interconnects 222a may have a surface roughness that is lower than a surface roughness of the plurality of interconnects 222b. In some implementations, the plurality of interconnects 222b may have a surface roughness that is greater than a surface roughness of the plurality of high-density interconnects 222a. For example, the plurality of high-density interconnects 222a may include a surface roughness in a range of approximately 0.2-0.5 micrometers, and the plurality of interconnects 222b may include a surface roughness in a range of approximately 0.6-0.8 micrometers. As will be further described below, the difference in surface roughness may be due to the sand blasting that is performed on portions of the substrate 202. In particular, sand blasting may be performed on a portion of the substrate that includes the plurality of high-density interconnects 222a and a solder resist layer. The improved surface roughness of the high-density interconnects helps provides high-density interconnects with more consistent thicknesses, which can help improve the reliability of the substrate. Big differences in the thickness of high-density interconnects may lead to coupling issues. The reduction in surface roughness of high-density interconnects helps decrease differences in the thickness of high-density interconnects, which may help provide improved reliability of the substrate. The roughness of the surface of an interconnect may be defined differently. For example, the roughness of the surface of an interconnect may be defined by Ra (which may be an arithmetical mean deviation). The variation of the vertical thickness of an interconnect may be quantified as roughness (Ra). For example, Ra for a surface of an interconnect may be defined as $1/n\Sigma_{i=}{}^{n}y_i$, where n is the number of measurements across a profile and $y_i$ is a vertical difference/vertical distance from a nominal surface of the interconnect.

The solder resist layer 270 may include different portions with different thicknesses. For example, the solder resist layer 270 may include a first solder resist layer portion 270a, a second solder resist layer portion 270b and a third solder resist layer portion 270c. The first solder resist layer portion 270a may be located in the escape portion 224 of the substrate 202. The solder resist layer 270 includes a first thickness and a second thickness. A first portion (e.g., 270a) of the solder resist layer 270 that is touching the plurality of high-density interconnects 222a includes the first thickness that is equal or less than a thickness of the plurality of high-density interconnects 222a. The first portion (e.g., 270a) of the solder resist layer 270 that is touching the plurality of high-density interconnects 222a may include a vertical cross section of the solder resist layer 270 that is touching the plurality of high-density interconnects 222a. A second portion (e.g., 270b, 270c) of the solder resist layer 270 that is touching the plurality of interconnects 222b includes the second thickness that is greater than a thickness of the plurality of interconnects 222b. The second portion (e.g., 270b, 270c) of the solder resist layer 270 that is touching the plurality of interconnects 222b includes a vertical cross section of the solder resist layer 270 that is touching the plurality of interconnects 222b. A first surface of the first portion (e.g., 270a) of the solder resist layer 270 that is touching the plurality of high-density interconnects 222a may be co-planar to a surface of the plurality of high-density interconnects 222a. Because the plurality of high-density interconnects 222a has lower minimum width and minimum spacing, it may not be possible to form a solder resist layer over the plurality of high-density interconnects 222a in a similar manner as the solder resist layer that is formed over the plurality of interconnects 222b. The plurality of high-density interconnects 222a may include interconnects that are non-solder mask defined (NSMD) pad interconnects. NSMD pad interconnects may be interconnects where the opening over the interconnects is not defined by a solder resist layer. As will be further described below, a fabrication process is described below that allows openings in the solder resist layer to be formed over and/or around high-density interconnects (e.g., 222a). An opening in the solder resist layer (e.g., solder resist layer portion) over and/or around high-density interconnects may exist by virtue of the fact that the solder resist layer portion has a thickness that is equal or less than a thickness of the high-density interconnects. Normally, these high-density interconnects are so small and/or so close to each other, that it is not possible to form openings in the solder resist layer over these high-density interconnects. Without the opening in the solder resist layer portion (e.g., 270a) that exposes the high-density interconnects (e.g., 222a), the escape portion 224 in the substrate would not exist, since the solder interconnects (e.g., 280a) would not be able to couple to the high-density interconnects (e.g., 222a). However, the disclosure describes a process that allows openings in the solder resist layer (e.g., solder resist layer portion 270a) over high-density interconnects, which exposes the high-density interconnects, and allows for the formation of the escape portion 224 in the substrate. The escape portion 224 allows for the efficient routing of interconnects between a substrate (e.g., 224, 302) and an integrated device (e.g., 208). This technical advantage is applicable to any of the escape portions, the high-density interconnects and/or solder resist layer portion with reduced thickness, described in the disclosure. The escape portion (e.g., 224) may be defined by a region that includes the first solder resist layer portion 270a and high-density interconnects (e.g., 222a). The high-density interconnects (e.g., 222a) located in an escape portion may not be vertically covered by a solder resist layer.

It is noted that solder resist layer 270 may have more than two thicknesses. For example, in some implementations, the first solder resist layer portion 270a that is located in the escape portion 224 may have more than one thickness. In one example, (i) a part of a first portion (e.g., 270a) of the solder resist layer 270 that is touching an interconnect from the plurality of high-density interconnects 222a may include the first thickness that is equal to a thickness of the plurality of high-density interconnects 222a, (ii) another part of the firstportion (e.g., 270a) of the solder resist layer 270 that is touching another interconnect from the plurality of high-density interconnects 222a may include a third thickness that is less than a thickness of the plurality of high-density interconnects 222a, and (iii) a second portion (e.g., 270b, 270c) of the solder resist layer 270 that is touching the plurality of interconnects 222b includes a second thickness that is greater than a thickness of the plurality of interconnects 222b.

As mentioned above, the integrated device 208 is coupled to the substrate 202 through the plurality of solder interconnects 280. The plurality of solder interconnects 280 includes the plurality of solder interconnects 280a and the plurality of solder interconnects 280b. The plurality of solder interconnects 280a may be coupled to interconnects located in the escape portion 224 of the substrate 202. The plurality of solder interconnects 280a is coupled to the plurality of high-density interconnects 222a. The integrated device 208 is coupled to the substrate 202 such that there is a void 275 between the substrate 202 and the integrated device 208 in a region that vertically overlaps with the escape portion 224 of the substrate 202. A void may be at least one region that is free of a solid material. A void may include a cavity. A void may be occupied by a gas (e.g., air). In the void 275, at least one solder interconnect from the plurality of solder interconnects 280a may not be laterally touching the solder resist layer 270. The plurality of solder interconnects 280b may be coupled to interconnects located in the non-escape portion 226 of the substrate 202. The plurality of solder interconnects 280b is coupled to the plurality of interconnects 222b. The plurality of solder interconnects 280b may be laterally touching the solder resist layer 270. A plurality of solder interconnects 290 is coupled to the second surface of the substrate 202. The plurality of solder interconnects 290 may be located laterally to the integrated device 208.

Figure 3:
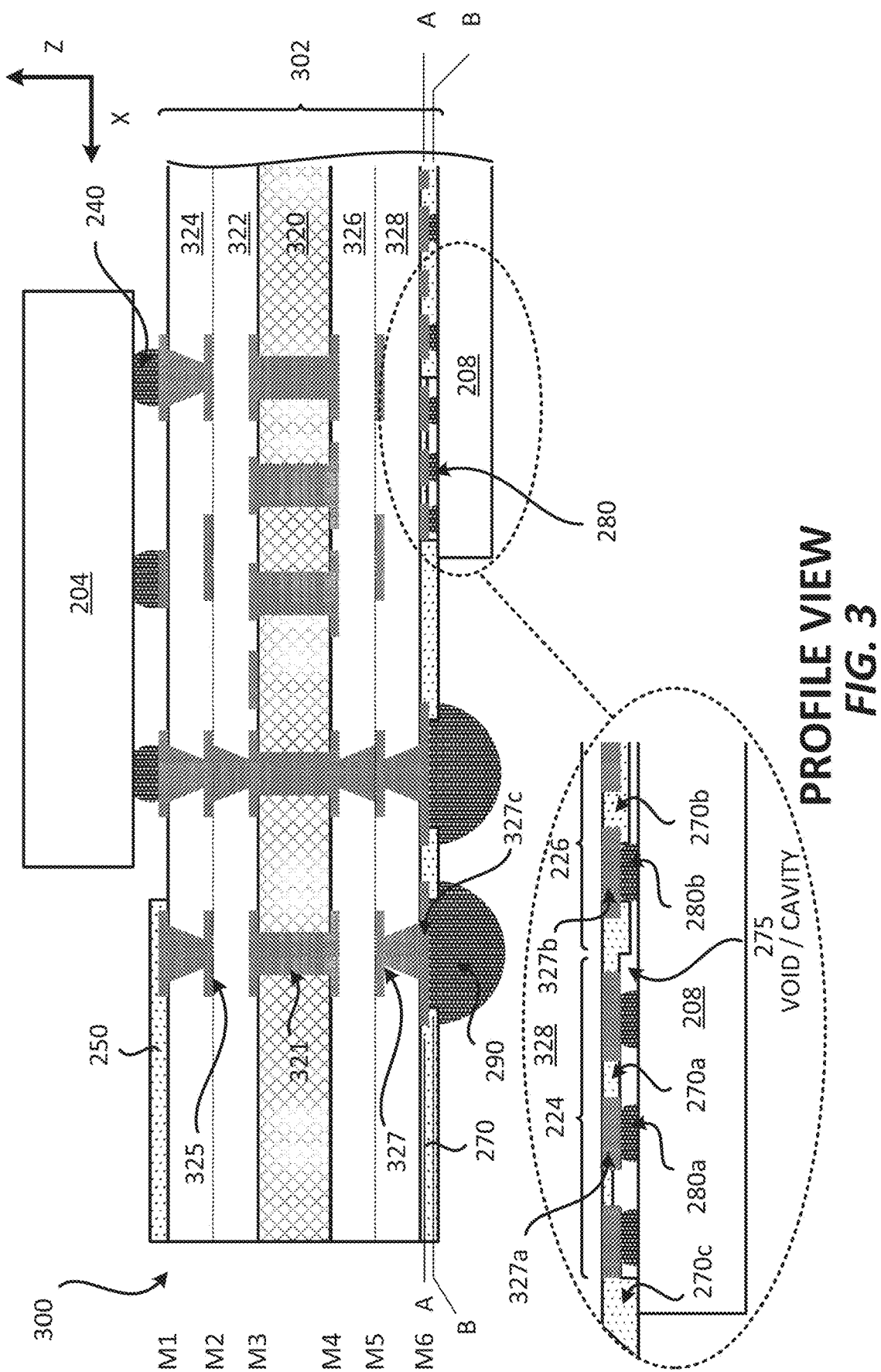
FIG. 3 illustrates a profile view of a package that includes a substrate and an integrated device coupled to high-density interconnects and interconnects that are embedded in the solder resist layer of the substrate.

FIG. 3 illustrates a package 300 that includes a substrate 302, the integrated device 204 and the integrated device 208. The package 300 may be similar to the package 200, and thus may include similar components and/or be arranged in a similar manner as the package 200. The substrate 302 may be similar to the substrate 202, and thus may include similar components and/or be arranged in a similar manner as the substrate 302. The integrated device 204 is coupled to a first surface (e.g., top surface) of the substrate 302 through the plurality of solder interconnects 240. The integrated device 208 is coupled to a second surface (e.g., bottom surface) of the substrate 302 through the plurality of solder interconnects 280.

The substrate 302 may be a laminated substrate that includes a core layer. The substrate 302 includes a core layer 320, at least one first dielectric layer (e.g., 322, 324), at least one second dielectric layer (e.g., 326, 328), the solder resist layer 250, the solder resist layer 270, a plurality of core interconnects 321, a plurality of interconnects 325 and a plurality of interconnects 327. The core layer 320 may include glass or glass fiber with resin. However, the core layer 320 may include different materials. The dielectric layers 322, 324, 326 and/or 328 may each include prepreg (e.g., a prepreg layer). The dielectric layers 322, 324, 326 and/or 328 may be build up layers. The dielectric layers 322, 324, 326 and/or 328 may include a different material than the core layer 320. As will be further described below, different implementations may have different numbers of dielectric layers and/or different numbers of metal layers. FIG. 3 illustrates a substrate that includes 6 metal layers (e.g., M1, M2, M3, M4, M4, M5, M6). However, a substrate may include more or less metal layers and/or more or less dielectric layers. For example, as will be further illustrated and described below in at least FIG. 6, a substrate may include 10 metal layers.

The plurality of interconnects 327 includes a plurality of high-density interconnects 327a (e.g., plurality of first interconnects) and a plurality of interconnects 327b (e.g., plurality of second interconnects). The core layer 320 includes a first surface and a second surface. The at least one first dielectric layer (e.g., 322, 324) is located over the first surface of the core layer 320. The at least one second dielectric layer (e.g., 326, 328) is located over the second surface of the core layer 320. The plurality of high-density interconnects 327a is located over a surface of the at least one second dielectric layer 328. The plurality of interconnects 327b located over the surface of the at least one second dielectric layer 328. The solder resist layer 270 is located over the surface of the at least one second dielectric layer 328. The plurality of high-density interconnects 327a is co-planar to the plurality of interconnects 327b. The plurality of high-density interconnects 327a and the plurality of interconnects 327b may be located on the same metal layer (e.g., M6) of the substrate 302. The solder resist layer 270 includes a first thickness and a second thickness. A first portion (e.g., 270a) of the solder resist layer 270 that is touching the plurality of high-density interconnects 327a includes the first thickness that is equal or less than a thickness of the plurality of high-density interconnects 327a. A second portion (e.g., 270b, 270c) of the solder resist layer 270 that is touching the plurality of interconnects 327b includes the second thickness that is greater than a thickness of the plurality of interconnects 327b.

It is noted that solder resist layer 270 may have more than two thicknesses. For example, in some implementations, the first solder resist layer portion 270a that is located in the escape portion 224 may have more than one thickness. In one example, (i) a part of a first portion (e.g., 270a) of the solder resist layer 270 that is touching an interconnect from the plurality of high-density interconnects 327a may include the first thickness that is equal to a thickness of the plurality of high-density interconnects 327a, (ii) another part of the first portion (e.g., 270a) of the solder resist layer 270 that is touching another interconnect from the plurality of high-density interconnects 327a may include a third thickness that is less than a thickness of the plurality of high-density interconnects 327a, and (iii) a second portion (e.g., 270b, 270c) of the solder resist layer 270 that is touching the plurality of interconnects 327b includes the second thickness that is greater than a thickness of the plurality of interconnects 327b. The plurality of high-density interconnects 327a may include pads (e.g., pad interconnects) and/or traces (e.g., trace interconnects). In some implementations, the surface of the trace interconnects and/or the pad interconnects from the plurality of high-density interconnects 327a that faces away from the substrate 302 may not be covered by a solder resist layer.

As mentioned above, the integrated device 208 is coupled to the substrate 302 through the plurality of solder interconnects 280. The plurality of solder interconnects 280 includes the plurality of solder interconnects 280a and the plurality of solder interconnects 280b. The plurality of solder interconnects 280a may be coupled to interconnects located in the escape portion 224 of the substrate 302. The plurality of solder interconnects 280a is coupled to the plurality of high-density interconnects 327a. The integrated device 208 is coupled to the substrate 302 such that there is a void 275 between the substrate 302 and the integrated device 208 in a region that vertically overlaps with the escape portion 224 of the substrate 302. A void may be at least one region that is free of a solid material. A void may include a cavity. A void may be occupied by a gas (e.g., air). In the void 275, at least one solder interconnect from the plurality of solder interconnects 280a may not be laterally touching the solder resist layer 270. The plurality of solder interconnects 280b may be coupled to interconnects located in the non-escape portion 226 of the substrate 302. The plurality of solder interconnects 280b is coupled to the plurality of interconnects 327b. The plurality of solder interconnects 280b may be laterally touching the solder resist layer 270. A plurality of solder interconnects 290 is coupled to the second surface of the substrate 302. The plurality of solder interconnects 290 may be located laterally to the integrated device 208.

Figure 4:
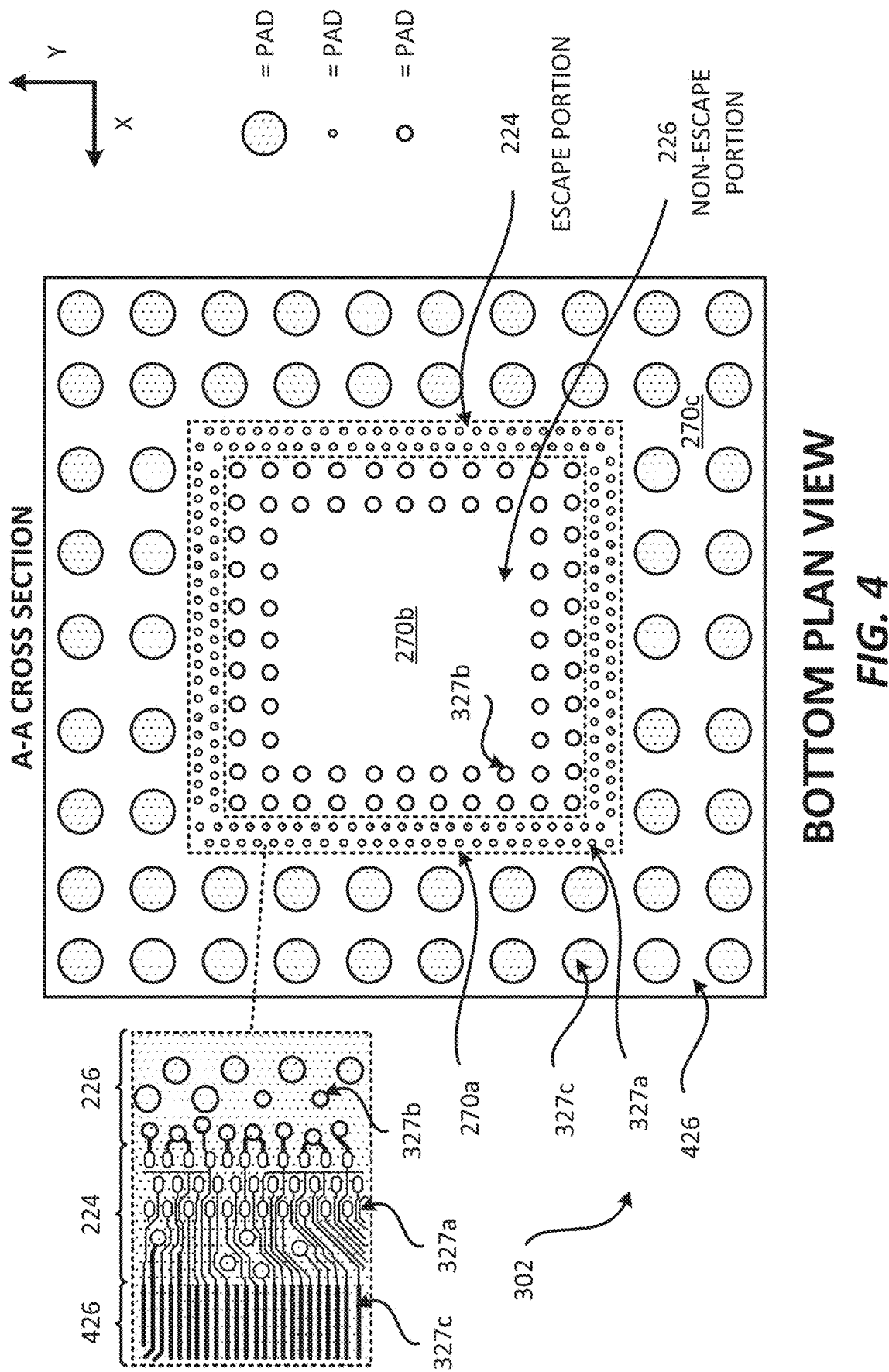
FIG. 4 illustrates a plan view of a substrate that includes high-density interconnects and interconnects embedded in the solder resist layer of the substrate.

FIG. 4 illustrates a plan view of the AA cross section of the substrate 302. As shown in FIG. 4, the substrate 302 includes a solder resist layer 270 that includes the first solder resist layer portion 270a, the second solder resist layer portion 270b, the third solder resist layer portion 270c, a plurality of high-density interconnects 327a, a plurality of interconnects 327b and a plurality of interconnects 327c. The plurality of high-density interconnects 327a and the first solder resist layer portion 270a are located in the escape portion 224 of the substrate 302. The plurality of interconnects 327b and the second solder resist layer portion 270b are located in the non-escape portion 226 of the substrate 302. The escape portion 224 may laterally surround the non-escape portion 226. The integrated device 208, when coupled to the substrate 302, may vertically overlap with the escape portion 224 and the non-escape portion 226 of the substrate 302. The substrate 302 may also include a portion 426. The portion 426 may include a plurality of interconnects 327c. The portion 426 is a portion of the substrate that does not vertically overlap with the integrated device 208. The escape portion 224 may be located between the portion 426 and the non-escape portion 226. The portion 426 includes interconnects that have higher minimum width and/or higher minimum spacing than the minimum width and/or minimum spacing of the interconnects of the escape portion 224. The portion 426 includes interconnects that have minimum width and/or minimum spacing that is equal and/or higher than the minimum width and/or minimum spacing of interconnects of the non-escape portion 226.

FIG. 5 illustrates a plan view of the BB cross section of the substrate 302. As shown in FIG. 5, the substrate 302 includes a solder resist layer 270 that includes the first solder resist layer portion 270a, the second solder resist layer portion 270b, the third solder resist layer portion 270c, a plurality of solder interconnects 280a, a plurality of solder interconnects 280b and a plurality of solder interconnects 290. The plurality of solder interconnects 280a may be coupled to the plurality of high-density interconnects 327a. The plurality of solder interconnects 280a may be located in a void 275. A void may be at least one region that is free of a solid material. A void may include a cavity. A void may be occupied by a gas (e.g., air). The plurality of solder interconnects 280a may be free of lateral touching of the solder resist layer 270. The plurality of solder interconnects 280b may be coupled to the plurality of interconnects 327b. The plurality of solder interconnects 290 may be coupled to the plurality of interconnects 327c. The plurality of interconnects 327c may be coupled to the plurality of interconnects 327a. The plurality of interconnects 327a may be coupled to the plurality of solder interconnects 280a. The combination of FIGS. 4 and 5 illustrates how an integrated device may be configured to be electrically coupled to the solder interconnects 290 through the escape portion 224. It is noted that the FIGS. 4 and 5 is not limited to being applicable to FIG. 3. FIGS. 4 and 5 may also be applicable to FIG. 6. That is, the planar cross sections shown in FIGS. 4 and 5 may also be applicable to the substrate of FIG. 6 below.

FIG. 6 illustrates a profile view of a package 600 that includes a substrate comprising high-density interconnects embedded in a solder resist layer. The package 600 is similar to the package 300 of FIG. 3 and thus includes the same or similar components as the package 300. The package 600 includes a substrate 602, the integrated device 204 and the integrated device 208. The substrate 602 is similar to the substrate 302, and thus includes similar components as the substrate 302. The substrate 302 includes 6 metal layers, while the substrate 602 includes 10 metal layers.

The substrate 602 may be a laminated substrate that includes a core layer. The substrate 602 includes a core layer 320, at least one first dielectric layer 622 at least one second dielectric layer 626, a solder resist layer 250, a solder resist layer 270, a plurality of core interconnects 621, a plurality of interconnects 625 and a plurality of interconnects 627. The core layer 320 may include glass or glass fiber with resin. However, the core layer 320 may include different materials. The dielectric layers 622 and/or 626 may each include prepreg (e.g., a prepreg layer). The dielectric layers 622 and/or 626 may be build up layers. The dielectric layers 622 and/or 626 may include a different material than the core layer 320.

The plurality of interconnects 627 includes a plurality of high-density interconnects 627a (e.g., plurality of first interconnects) and a plurality of interconnects 627b (e.g., plurality of second interconnects). The core layer 320 includes a first surface and a second surface. The at least one first dielectric layer 622 is located over the first surface of the core layer 320. The at least one second dielectric layer 626 is located over the second surface of the core layer 320. The plurality of high-density interconnects 627a is located over a surface of the at least one second dielectric layer 628. The plurality of interconnects 627b is located over the surface of the at least one second dielectric layer 628. The solder resist layer 270 is located over the surface of the at least one second dielectric layer 628. The plurality of high-density interconnects 627a is co-planar to the plurality of interconnects 627b. The plurality of high-density interconnects 627a is located on a same metal layer of the substrate 602 as the plurality of interconnects 627b. The solder resist layer 270 includes a first thickness and a second thickness. A first portion (e.g., 270a) of the solder resist layer 270 that is touching the plurality of high-density interconnects 627a includes the first thickness that is equal or less than a thickness of the plurality of high-density interconnects 627a. A second portion (e.g., 270b, 270c) of the solder resist layer 270 that is touching the plurality of interconnects 627b includes the second thickness that is greater than a thickness of the plurality of interconnects 627b. The plurality of high-density interconnects 627a may include pads (e.g., pad interconnects) and/or traces (e.g., trace interconnects). In some implementations, the surface of the trace interconnects and/or the pad interconnects from the plurality of high-density interconnects 627a that faces away from the substrate 602 may not be covered by a solder resist layer.

It is noted that solder resist layer 270 may have more than two thicknesses. For example, in some implementations, the first solder resist layer portion 270a that is located in the escape portion 224 may have more than one thickness. In one example, (i) a part of a first portion (e.g., 270a) of the solder resist layer 270 that is touching an interconnect from the plurality of high-density interconnects 627a may include the first thickness that is equal to a thickness of the plurality of high-density interconnects 627a, (ii) another part of the first portion (e.g., 270a) of the solder resist layer 270 that is touching another interconnect from the plurality of high-density interconnects 627a may include a third thickness that is less than a thickness of the plurality of high-density interconnects 627a, and (iii) a second portion (e.g., 270b, 270c) of the solder resist layer 270 that is touching the plurality of interconnects 627b includes the second thickness that is greater than a thickness of the plurality of interconnects 627b.

As mentioned above, the integrated device 208 is coupled to the substrate 602 through the plurality of solder interconnects 280. The plurality of solder interconnects 280 includes the plurality of solder interconnects 280a and the plurality of solder interconnects 280b. The plurality of solder interconnects 280a may be coupled to interconnects located in the escape portion 224 of the substrate 602. The plurality of solder interconnects 280a is coupled to the plurality of high-density interconnects 627a. The integrated device 208 is coupled to the substrate 602 such that there is a void 275 between the substrate 602 and the integrated device 208 in a region that vertically overlaps with the escape portion 224 of the substrate 602. A void may be at least one region that is free of a solid material. A void may include a cavity. A void may be occupied by a gas (e.g., air). In the void 275, at least one solder interconnect from the plurality of solder interconnects 280a may not be laterally touching the solder resist layer 270. The plurality of solder interconnects 280b may be coupled to interconnects located in the non-escape portion 226 of the substrate 602. The plurality of solder interconnects 280b is coupled to the plurality of interconnects 627b. The plurality of solder interconnects 280b may be laterally touching the solder resist layer 270. A plurality of solder interconnects 290 is coupled to the second surface of the substrate 602. The plurality of solder interconnects 290 may be located laterally to the integrated device 208.

As shown in FIGS. 3 and 6, the substrate (e.g., 302, 602) includes at least one dielectric layer (e.g., 322, 324, 326, 328, 622, 626), a plurality of interconnects (e.g., 327, 627), a solder resist layer 250 and a solder resist layer 270. The solder resist layer 250 may be located on the first surface of the substrate (e.g., 302, 602). The solder resist layer 270 may be located on second surface of the substrate (e.g., 302, 602). Some interconnects from the plurality of interconnects (e.g., 327, 627) may be embedded in the solder resist layer 270. For example, the plurality of interconnects (e.g., 327, 627) may include a plurality of high-density interconnects (e.g.,

327a, 627a) and a plurality of interconnects (e.g., 327b, 627b). The plurality of high-density interconnects (e.g., 327a, 627a) and the plurality of interconnects (e.g., 327b, 627b) may be co-planar to each other. The plurality of high-density interconnects (e.g., 327a, 627a) and the plurality of interconnects (e.g., 327b, 627b) may be located on a same metal layer of the substrate (e.g., 302, 602). The plurality of high-density interconnects (e.g., 327a, 627a) and the plurality of interconnects (e.g., 327b, 627b) are embedded in the solder resist layer 270. The substrate (e.g., 302, 602) may include an escape portion 224 and a non-escape portion 226. The plurality of high-density interconnects (e.g., 327a, 627a) may be located in the escape portion 224 of the substrate (e.g., 302, 602). In some implementations, the plurality of high-density interconnects (e.g., 327a, 627a) may have a lower minimum width and minimum spacing than the minimum width and minimum spacing of the plurality of interconnects (e.g., 327b, 627b). For example, the plurality of high-density interconnects (e.g., 327a, 627a) may include interconnects with (i) a minimum width of 8 micrometers and (ii) a minimum spacing of 10 micrometers, and the plurality of interconnects (e.g., 327b, 627b) may include interconnects with (i) a minimum width of 20 micrometers and (ii) a minimum spacing of 25 micrometers.

In some implementations, the plurality of high-density interconnects (e.g., 327a, 627a) may have a surface roughness that is lower than a surface roughness of the plurality of interconnects (e.g., 327b, 627b). In some implementations, the plurality of interconnects (e.g., 327b, 627b) may have a surface roughness that is greater than a surface roughness of the plurality of high-density interconnects (e.g., 327a, 627a). For example, the plurality of high-density interconnects (e.g., 327a, 627a) may include a surface roughness in a range of approximately 0.2-0.5 micrometers, and the plurality of interconnects (e.g., 327b, 627b) may include a surface roughness in a range of approximately 0.6-0.8 micrometers. As will be further described below, the difference in surface roughness may be due to the sand blasting that is performed on portions of the substrate.

The term "high-density interconnect(s)" may mean that the interconnect(s) has/have a lower minimum line (e.g., width), minimum spacing and/or minimum pitch, than the minimum line (e.g., width), minimum spacing and/or minimum pitch of interconnects (e.g., core interconnects) in other parts of the substrate. The plurality of high-density interconnects (e.g., 222a, 327a, 627a) may be a means for high-density interconnection. The plurality of interconnects (e.g., 222b, 327b, 627b) may be a means for interconnection.

An integrated device (e.g., 204, 208) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, processor, memory and/or combinations thereof. An integrated device (e.g., 204) may include at least one electronic circuit (e.g., first electronic circuit, second electronic circuit, etc. . . . ).

The package (e.g., 200, 300, 600) may be implemented in a radio frequency (RF) package. The RF package may be a radio frequency front end package (RFFE). A package (e.g., 200, 300, 600) may be configured to provide Wireless Fidelity (WiFi) communication and/or cellular communication (e.g., 2G, 3G, 4G, 5G). The packages (e.g., 200, 300, 600) may be configured to support Global System for Mobile Communications (GSM), Universal Mobile Telecommunications System (UMTS), and/or Long-Term Evolution (LTE). The packages (e.g., 200, 300, 600) may be configured to transmit and receive signals having different frequencies and/or communication protocols.

Having described various substrates comprising various high-density interconnects, a sequence for fabricating a substrate that includes high-density interconnects embedded in a solder resist layer will now be described below. As shown below, the substrates described in the disclosure provides a low-cost substrate, a high reliability substrate with a low short risk in the escape portion of the substrate. Moreover, the substrate may be fabricated using a shorter fabrication process, which helps reduce the cost of the substrate.

Exemplary Sequence for Fabricating a Substrate Comprising High-Density Interconnects Embedded in a Solder Resist Layer FIGS. 7A-7F illustrate an exemplary sequence for providing or fabricating a substrate that includes high-density interconnects embedded in a solder resist layer. In some implementations, the sequence of FIGS. 7A-7F may be used to provide or fabricate the substrate 302 of FIG. 3, or any of the substrates described in the disclosure.

It should be noted that the sequence of FIGS. 7A-7F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 7A:
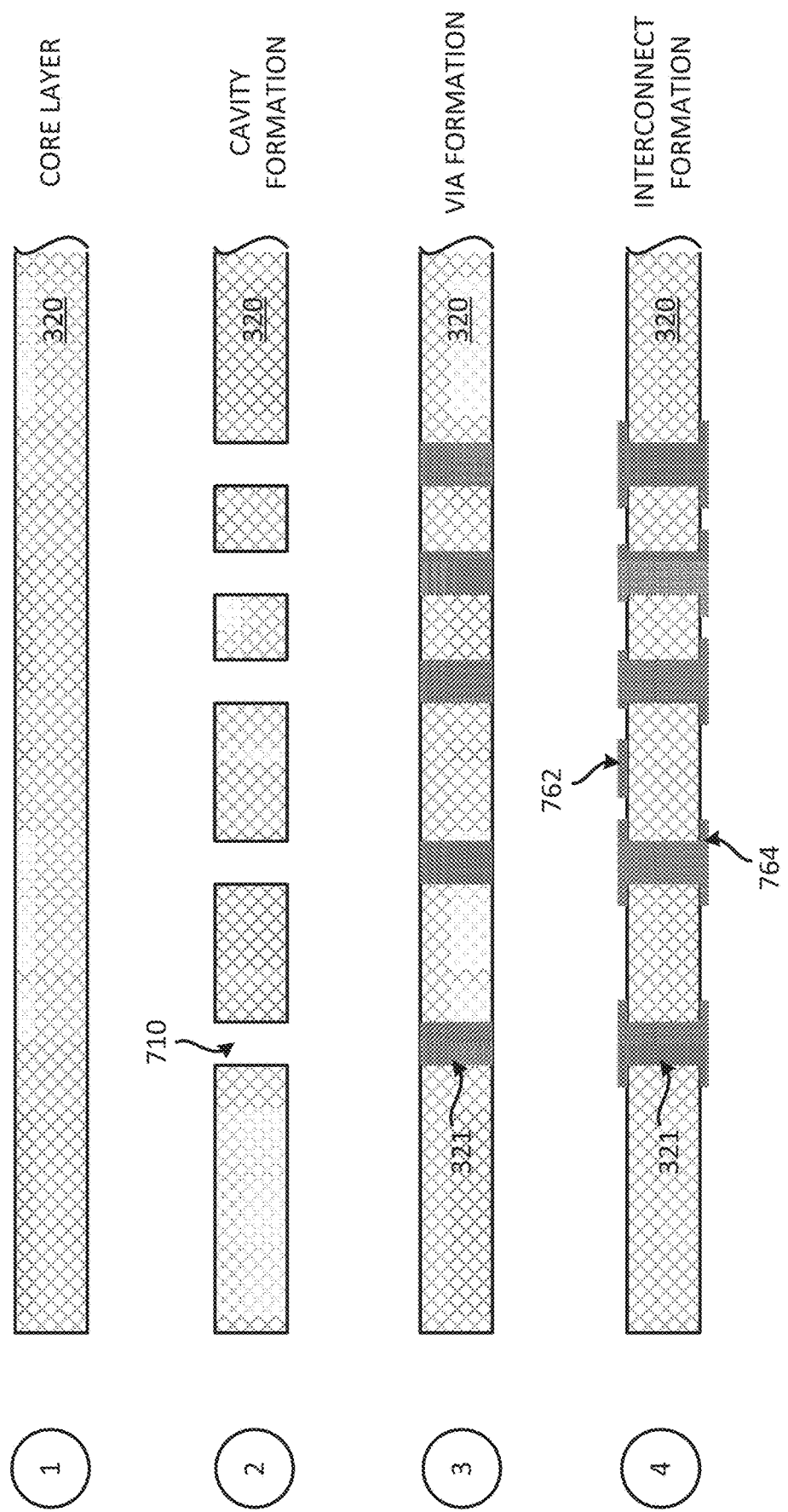
FIGS. 7A-7F illustrate an exemplary sequence for fabricating a substrate that includes a high-density interconnect embedded in a solder resist layer.

Stage 1, as shown in FIG. 7A, illustrates a state after a core layer 320 is provided. The core layer 320 may include glass or glass fiber with resin. However, the core layer 320 may include different materials. The core layer 320 may have different thicknesses.

Stage 2 illustrates a state after a plurality of cavities 710 is formed in the core layer 320. The plurality of cavities 710 may be formed through a laser process and/or a drilling process. The plurality of cavities 710 may travel through the core layer 320.

Stage 3 illustrates a state after a plurality of core interconnects are formed in the plurality of cavities 710. For example, a first plurality of core interconnects 321 may be formed in the plurality of cavities 710. A plating process may be used to form the first plurality of core interconnects 321. However, different implementations may use different processes for forming the first plurality of core interconnects 321. The first plurality of core interconnects 321 may include core vias located in the core layer 320.

Stage 4 illustrates a state after a plurality of interconnects 762 is formed over the first surface (e.g., top surface) of the core layer 320. The plurality of interconnects 762 may be coupled to the first plurality of core interconnects 321. Stage 4 also illustrates a state after a plurality of interconnects 764 is formed over the second surface (e.g., bottom surface) of the core layer 320. The plurality of interconnects 764 may be coupled to the first plurality of core interconnects 321. A patterning process, a stripping process and/or a plating process may be used to form the plurality of interconnects 762 and the plurality of interconnects 764.

Figure 7B:
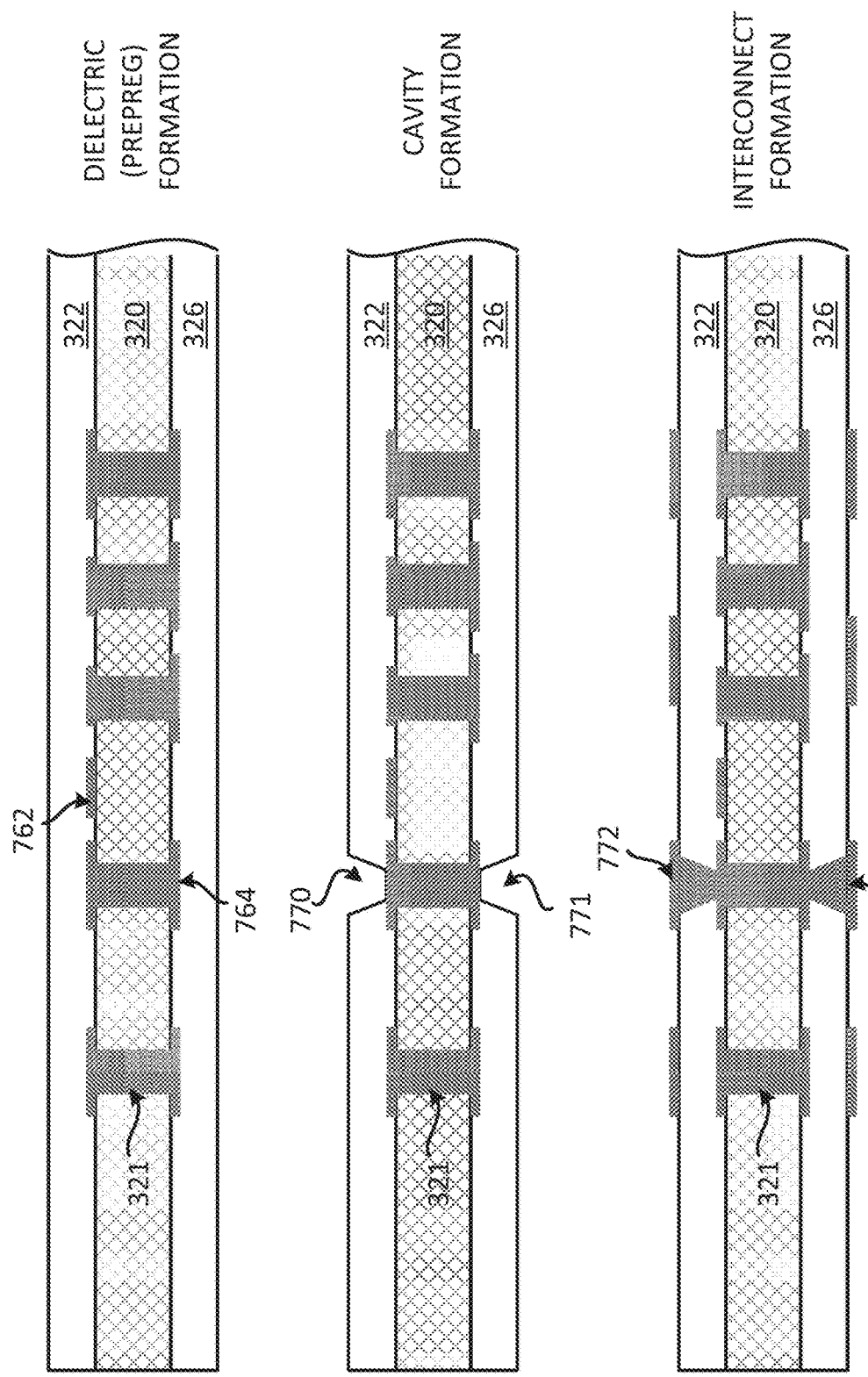

Stage 5, as shown in FIG. 7B, illustrates a state after a dielectric layer 322 is formed over the first surface of the core layer 320, and a dielectric layer 326 is formed over the second surface of the core layer 320. A deposition process and/or lamination process may be used to form dielectric layers 322 and 326. The dielectric layers 322 and 326 may include prepreg (e.g., prepreg layers).

Stage 6 illustrates a state after a plurality of cavities 770 is formed in the dielectric layer 322, and a plurality of cavities 771 is formed in the dielectric layer 326. A laser process (e.g., laser drilling, laser ablation) may be used to form the plurality of cavities 770 and the plurality of cavities 771.

Stage 7 illustrates a state after a plurality of interconnects 772 is formed over and coupled to the dielectric layer 322 and the plurality of cavities 770. The plurality of interconnects 772 may be coupled to the plurality of interconnects 762. Stage 11 also illustrates a state after a plurality of interconnects 774 is formed over and coupled the dielectric layer 326 and the plurality of cavities 771. The plurality of interconnects 774 may be coupled to the plurality of interconnects 764. A patterning process, a stripping process and/or a plating process may be used to form the plurality of interconnects 772 and the plurality of interconnects 774.

Figure 7C:
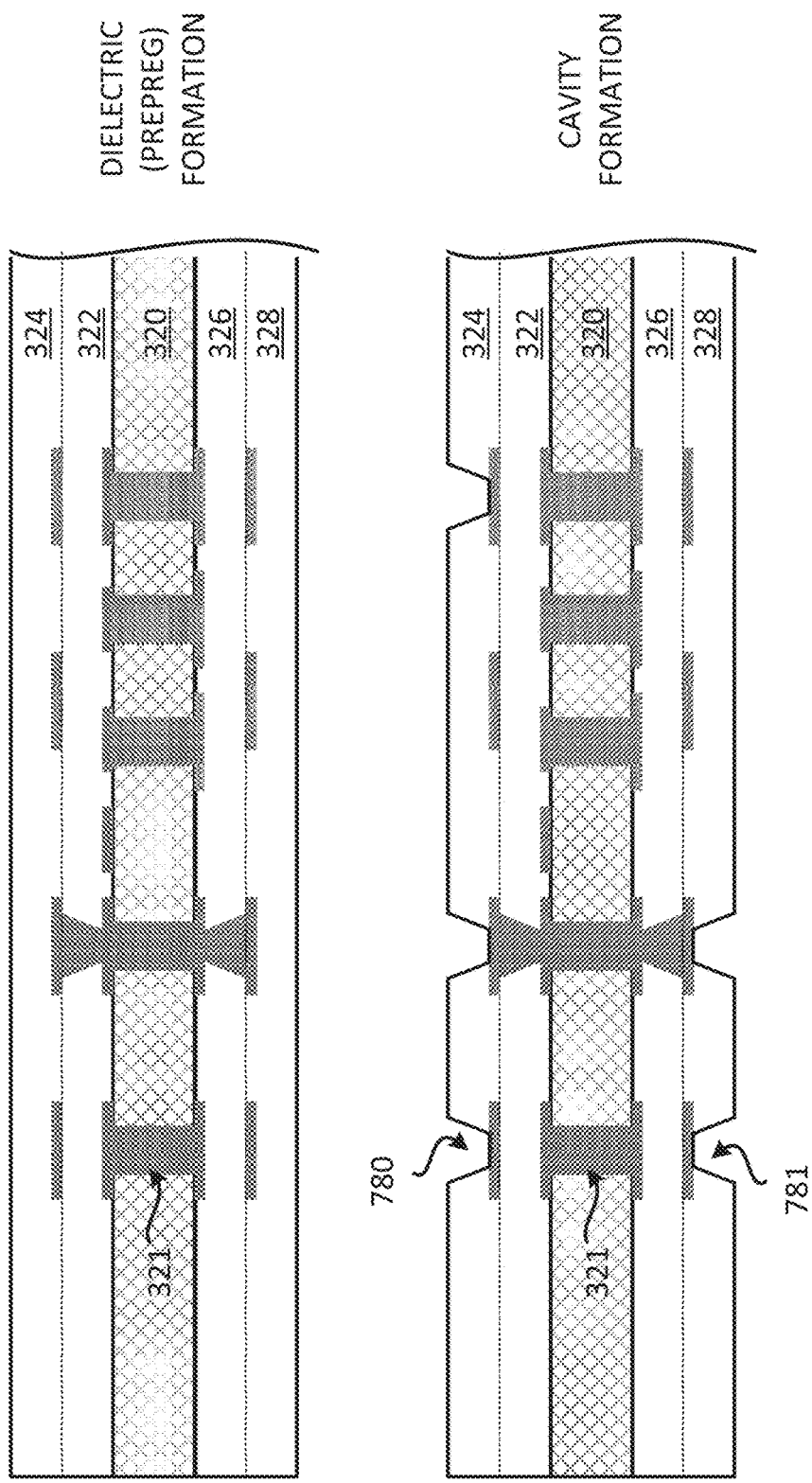

Stage 8, as shown in FIG. 7C, illustrates a state after a dielectric layer 324 is formed over and coupled to a first surface of dielectric layer 322, and a dielectric layer 328 is formed over and coupled to a second surface of the dielectric layer 326. A deposition process and/or lamination process may be used to form dielectric layers 324 and 328. The dielectric layers 324 and 328 may include prepreg (e.g., prepreg layers).

Stage 9 illustrates a state after a plurality of cavities 780 is formed in the dielectric layer 324, and a plurality of cavities 781 is formed in the dielectric layer 328. A laser process (e.g., laser drilling, laser ablation) may be used to form the plurality of cavities 780 and the plurality of cavities 781.

Figure 7D:
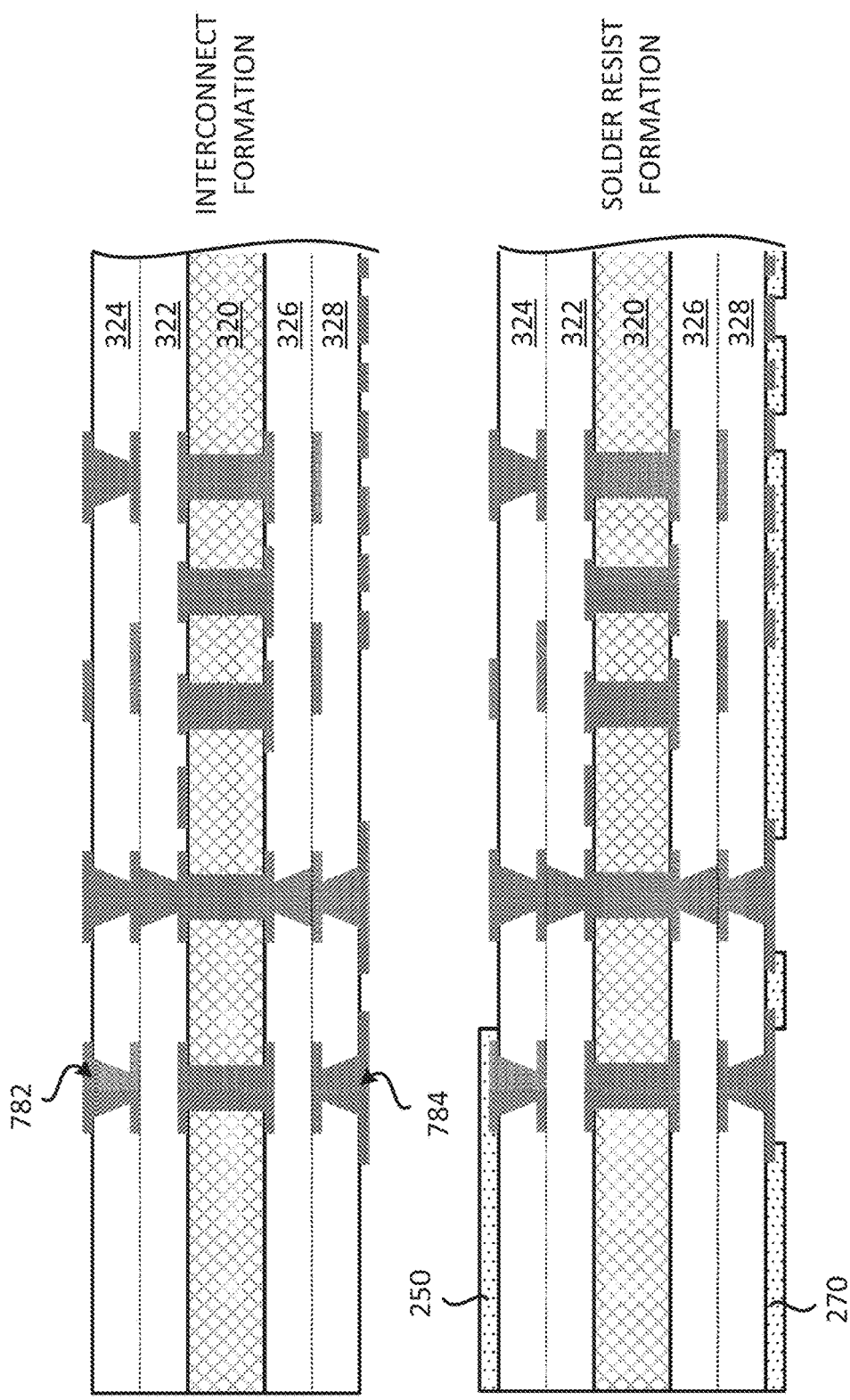

Stage 10, as shown in FIG. 7D, illustrates a state after a plurality of interconnects 782 is formed over and coupled to the dielectric layer 324 and the plurality of cavities 780. The plurality of interconnects 782 may be coupled to the plurality of interconnects 772. Stage 10 also illustrates a state after a plurality of interconnects 784 is formed over and coupled to the dielectric layer 328 and the plurality of cavities 781. The plurality of interconnects 784 may be coupled to the plurality of interconnects 774. A patterning process, a stripping process and/or a plating process may be used to form the plurality of interconnects 782 and the plurality of interconnects 784. It is noted that additional dielectric layers and additional interconnects may be formed by repeating Stages 8-10 of FIGS. 7C-7D, as described above.

Stage 11 illustrates a state after (i) the solder resist layer 250 is formed over the dielectric layer 324, and (ii) the solder resist layer 270 is formed over the dielectric layer 328. A deposition process may be used the solder resist layer 250 and the solder resist layer 270.

Figure 7E:
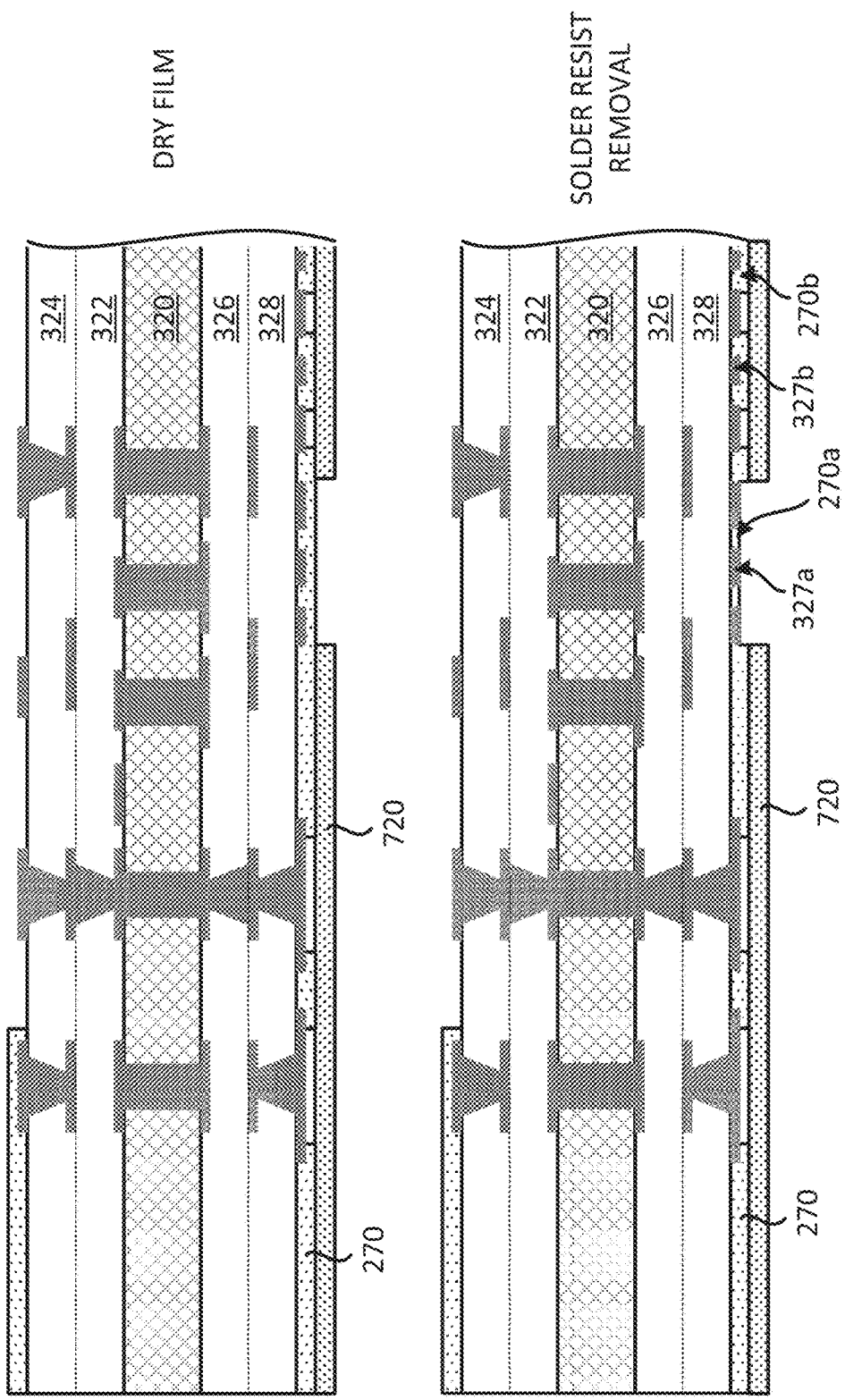

Stage 12, as shown in FIG. 7E, illustrates a state after a dry film 720 is formed over the solder resist layer 270, covering part of the solder resist layer 270 and exposing part of the solder resist layer 270.

Stage 13 illustrate a state after exposed portions of the solder resist layer 270 has been partially removed. For example, as shown in Stage 13, portions of the solder resist layer 270 may be removed such that the thickness of the remaining solder resist layer 270 is equal or less than the thickness of high-density interconnects 327a. In some implementations, some portions of the solder resist layer 270 may have a lower thickness than the thickness of the plurality of high-density interconnects 327a. In some implementations, some portions of the solder resist layer 270 may have a thickness that is equal to the thickness of the plurality of high-density interconnects 327a. A sand blasting process may be used to remove portions of the solder resist layer 270. Removing portions of the solder resist layer 270 may include thinning portions of the solder resist layer 270 in the escape portion 224 of the substrate 302. One effect of the sand blasting process is that the surface of the plurality of high-density interconnects 327a has a lower surface roughness than the surface of the of the plurality of interconnects 327b.

Figure 7F:
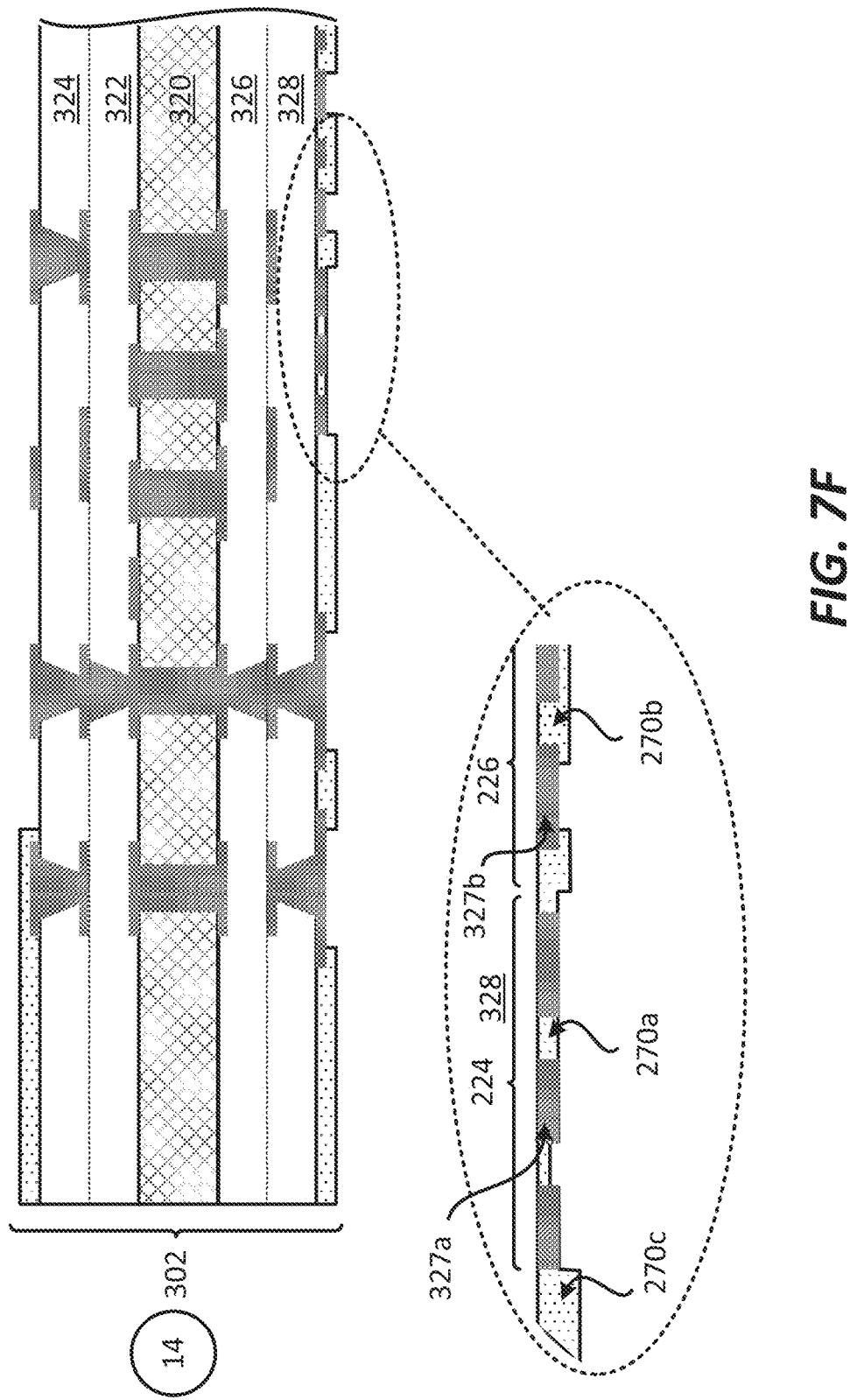

Stage 14, as shown in FIG. 7F, illustrates a state after the dry film 720 is removed leaving the substrate 302. As mentioned above, the substrate 302 includes a core layer 320 comprising a first surface and a second surface, at least one first dielectric layer (e.g., 322) located over a first surface of the core layer, at least one second dielectric layer (e.g., 326) located over a second surface of the core layer 320, a plurality of high-density interconnects 327a located over a surface of the at least one second dielectric layer 326, a plurality of interconnects 327b located over the surface of the at least one second dielectric layer 326, and a solder resist layer 270 located over the surface of the at least one second dielectric layer 326. The plurality of high-density interconnects 327a is co-planar to the plurality of interconnects 327b. The plurality of high-density interconnects 327a and the plurality of interconnects 327b may be located on a same metal layer of the substrate. The solder resist layer 270 includes a first thickness and a second thickness. A first portion of the solder resist layer 270 that is touching the plurality of high-density interconnects 327a includes the first thickness that is equal or less than a thickness of the plurality of high-density interconnects 327a. A second portion of the solder resist layer portion 270b that is touching the plurality of interconnects 327b includes the second thickness that is greater than a thickness of the plurality of interconnects 327b.

Figure 8:
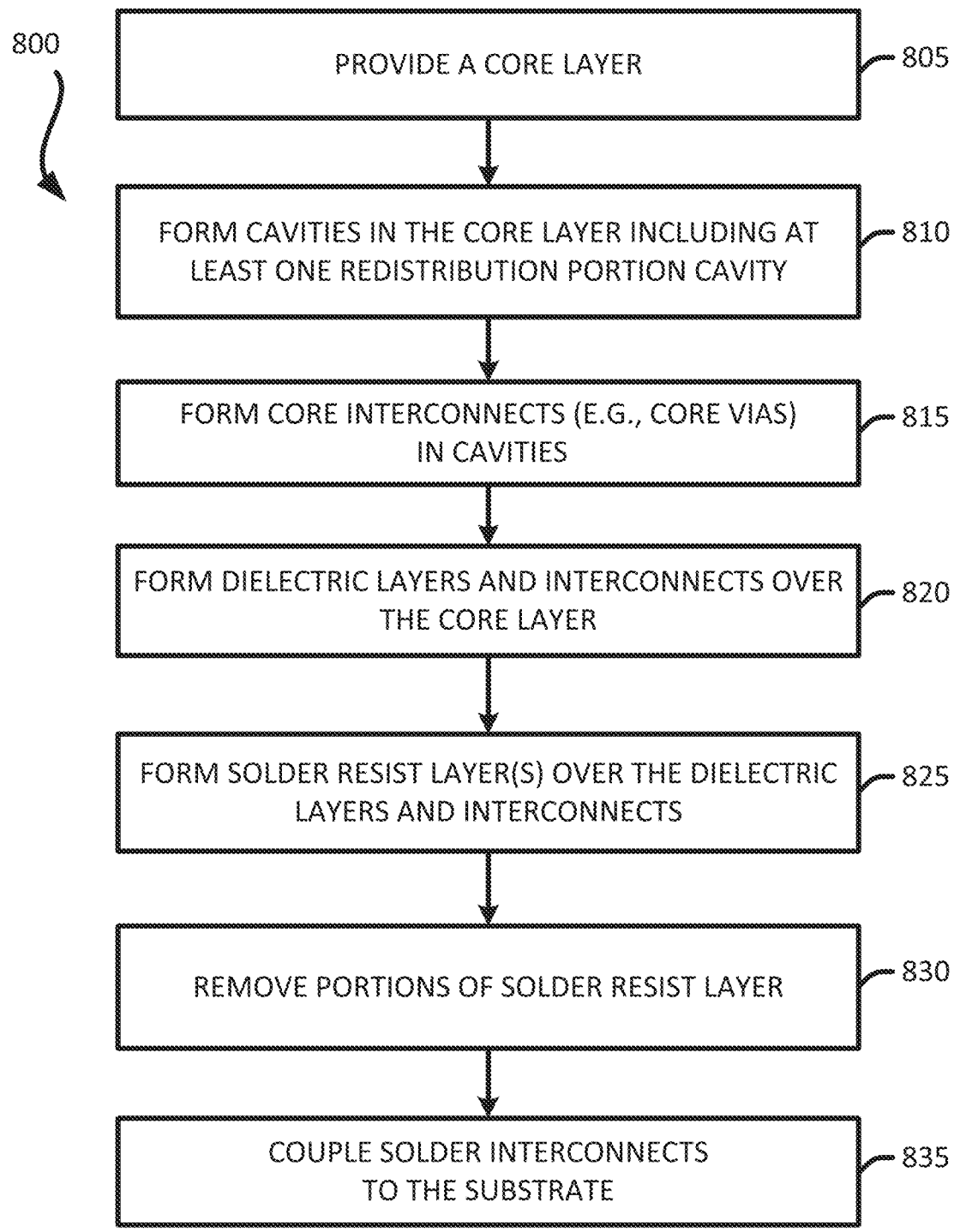
FIG. 8 illustrates an exemplary flow diagram of a method for fabricating a substrate that includes a high-density interconnect portion embedded in a core layer.

Exemplary Flow Diagram of a Method for Fabricating a Substrate Comprising High-Density Interconnects Embedded in a Solder Resist Layer In some implementations, fabricating a substrate includes several processes. FIG. 8 illustrates an exemplary flow diagram of a method 800 for providing or fabricating a substrate. In some implementations, the method 800 of FIG. 8 may be used to provide or fabricate the substrate of FIG. 2. For example, the method of FIG. 8 may be used to fabricate the substrate 202. However, the method of FIG. 8 may be used fabricate any substrate in the disclosure, such as for example, the substrates of FIGS. 3 and 6.

It should be noted that the method of FIG. 8 may combine one or more processes in order to simplify and/or clarify the method for providing or fabricating a substrate. In some implementations, the order of the processes may be changed or modified.

The method provides (at 805) a core layer (e.g., 320). The core layer 320 may include glass or glass fiber with resin. However, the core layer 320 may include different materials. The core layer 320 may have different thicknesses. Stage 1 of FIG. 7A illustrates an example of a core layer that is provided.

The method forms (at 810) a plurality of cavities (e.g., 710) in the core layer. A laser process or a drilling process may be used to form the cavities. The plurality of cavities may travel through the core layer 320. Stage 2 of FIG. 7A illustrate examples of forming cavities in the core layer.

The method form (at 815) a plurality of core interconnects (e.g., 321) in the plurality of cavities (e.g., 710). For example, a first plurality of core interconnects 321 may be formed in the plurality of cavities 710. A plating process may be used to form the first plurality of core interconnects 321. However, different implementations may use different processes for forming the first plurality of core interconnects 321. The first plurality of core interconnects 321 may include core vias located in the core layer 320. Stage 3 of FIG. 7A illustrates an example of core interconnects located in the core layer.

The method forms (at 820) a plurality of interconnects (e.g., 325, 327) and at least one dielectric layer (e.g., 322, 324) over a first surface of the core layer and a second surface of the core layer (e.g., 320). A patterning process, a stripping process and/or a plating process may be used to form the plurality of interconnects. A laser process (e.g., laser drilling, laser ablation) may be used to form the plurality of cavities in a dielectric layer. A deposition process and/or a lamination process may be used to form at least one dielectric layer. The at least one dielectric layer may include prepreg (e.g., prepreg layer). Stages 5-10 of FIGS. 7B-7D illustrate examples of forming a plurality of interconnects and at least one dielectric layer (e.g., prepreg).

The method forms (at 825) at least one solder resist layer (e.g., 250) over a first surface of a dielectric layer, and at least one solder resist layer (e.g., 270) over a second surface of a dielectric layer. A deposition process may be used to form the solder resist layer 250 and the solder resist layer 270. Stage 11 of FIG. 7D illustrates an example of forming solder resist layers over dielectric layers.

The method removes (at 830) portions of the solder resist layer (e.g., 270). Removing portions of the solder resist layer may include thinning portions of the solder resist layer. In some implementations, some portions of the solder resist layer 270 may have a lower thickness than the thickness of the plurality of high-density interconnects 327a. In some implementations, some portions of the solder resist layer 270 may have a thickness that is equal to the thickness of the plurality of high-density interconnects 327a. Different implementations may use different processes for removing portions of the solder resist layer. A sand blasting process may be used to remove portions of the solder resist layer 270. Removing portions of the solder resist layer 270 may include thinning portions of the solder resist layer 270 in the escape portion 224 of the substrate 302. Removing portions of the solder resist layer may include applying a dry film and performing sand blasting on portions of the solder resist layer that is exposed (e.g., free of the dry film). Once the sand blasting is done, the dry film may be removed. One effect of the sand blasting process is that the surface of the plurality of high-density interconnects 327a has a lower surface roughness than the surface of the of the plurality of interconnects 327b. Stages 12-14 of FIGS. 7E-7F illustrate an example of removing portions of a solder resist layer.

The method may couple (at 835) a plurality of solder interconnects (e.g., 290) to the substrate (e.g., 202, 302, 602). For example, a reflow solder process may be used to couple the plurality of solder interconnects 290 to the plurality of interconnects 327 of the substrate 202.

Figure 9A:
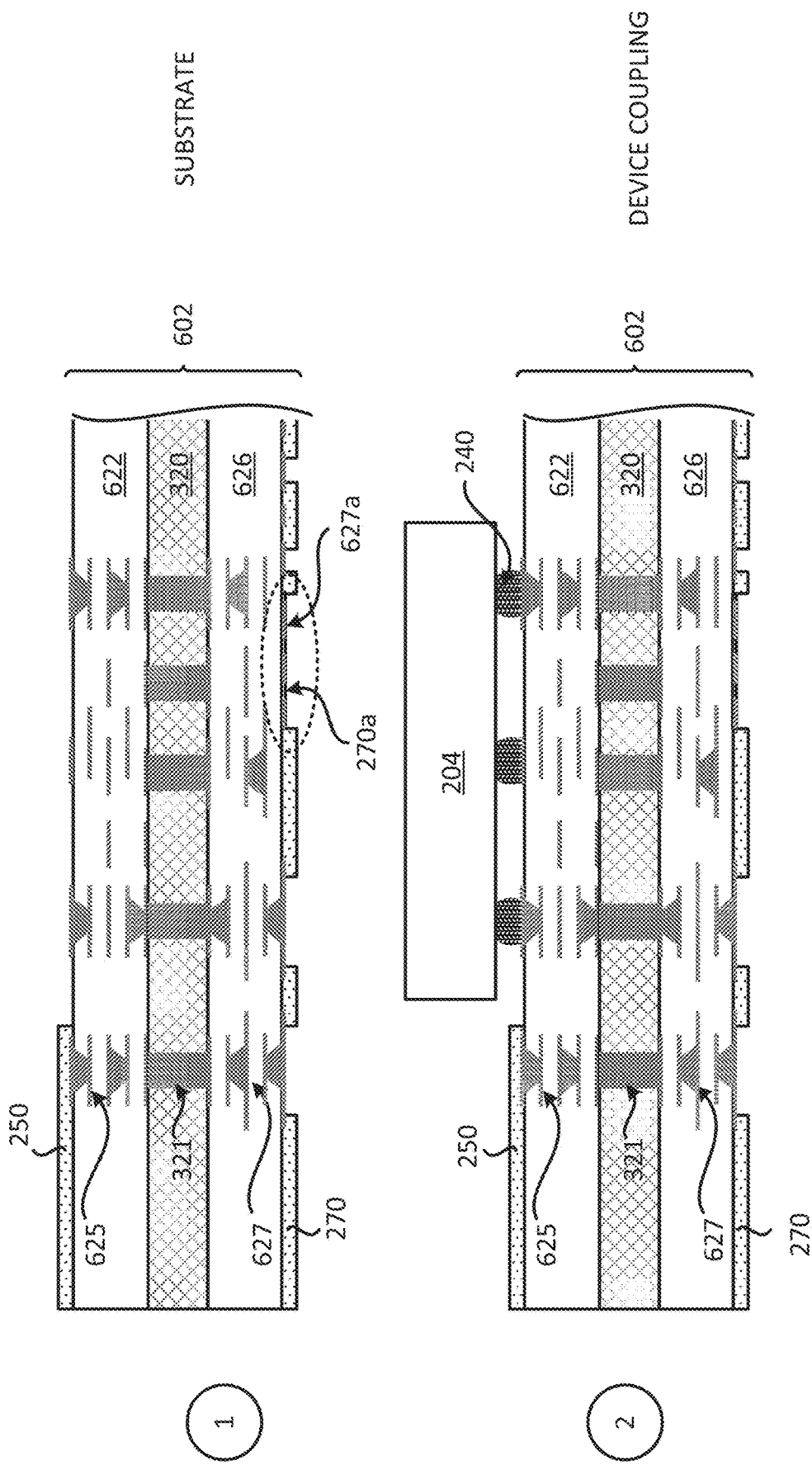
FIGS. 9A-9B illustrate an exemplary sequence for fabricating a package that includes an integrated device and a substrate that includes a high-density interconnect embedded in a solder resist layer.
Figure 9B:
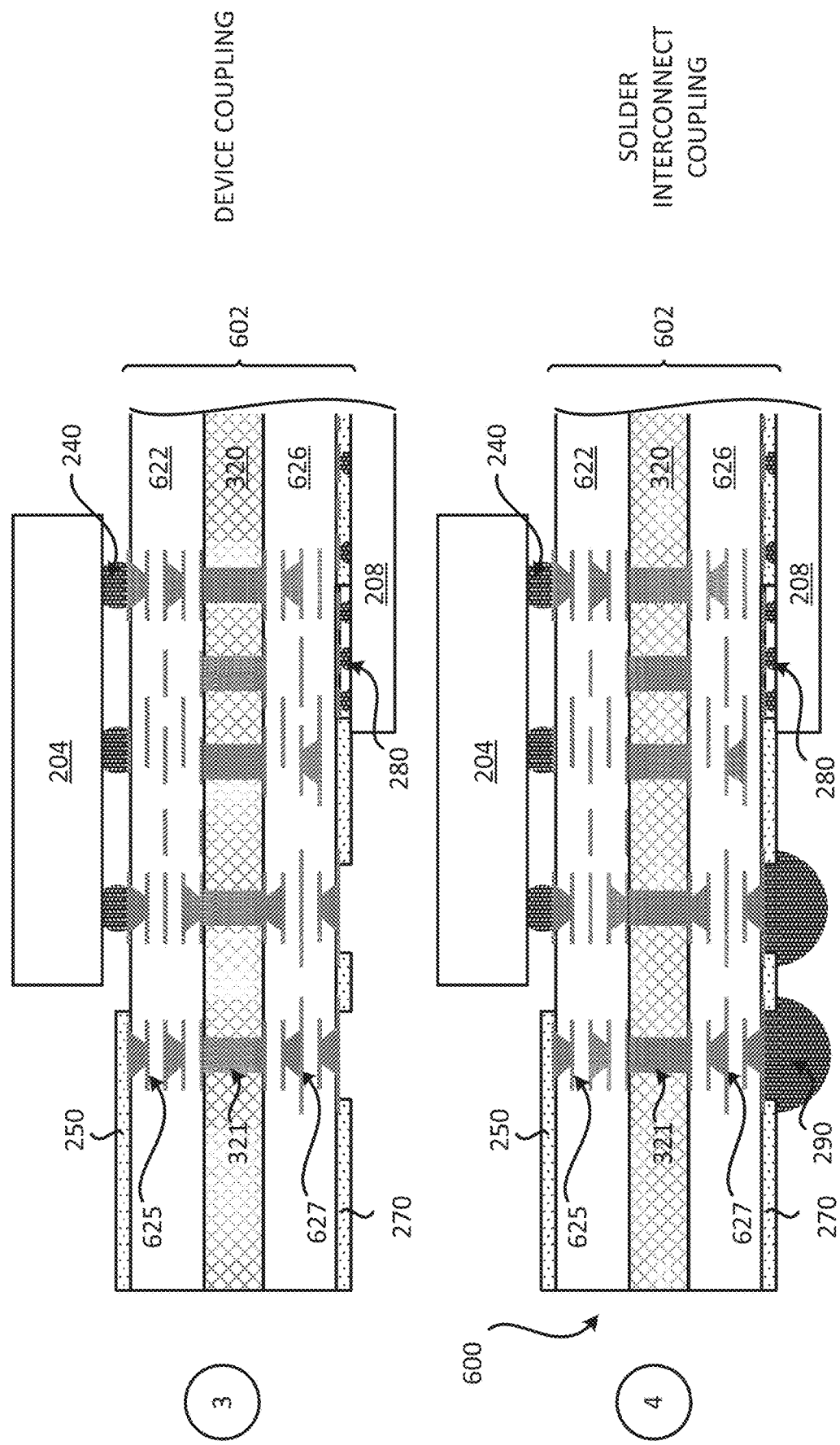

Exemplary Sequence for Fabricating a Package that Includes a Substrate Comprising High-Density Interconnects Embedded in a Solder Resist Layer FIGS. 9A-9B illustrate an exemplary sequence for providing or fabricating a package that includes a substrate comprising high-density interconnects embedded in a solder resist layer. In some implementations, the sequence of FIGS. 9A-9B may be used to provide or fabricate the package 600 of FIG. 6, or any of the packages described in the disclosure.

It should be noted that the sequence of FIGS. 9A-9B may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure. Different implementations may fabricate a package differently.

Stage 1, as shown in FIG. 9A, illustrates a state after a substrate 602 is provided. The substrate 602 may be provided using the process described in FIG. 7A-7F. The substrate 602 includes interconnects located (e.g., embedded) in a solder resist layer. Some of the interconnects that are located in the solder resist layer may have a thickness that is equal or greater than the thickness of the solder resist layer that is touching the interconnects.

Stage 2 illustrates a state after an integrated device 204 is coupled to the substrate 602 through the plurality of solder interconnects 240. A pick and place process may be used to place the integrated device 204 over a first surface of the substrate 602. A solder reflow process may be used to couple the integrated device 204 to the substrate 602.

Stage 3, as shown in FIG. 9B, illustrates a state after an integrated device 208 is coupled to the substrate 602 through the plurality of solder interconnects 280. A pick and place process may be used to place the integrated device 208 over a second surface of the substrate 602. A solder reflow process may be used to couple the integrated device 208 to the substrate 602.

Stage 4 illustrates a state a plurality of solder interconnects 290 is coupled to the substrate 602. A solder reflow process may be used to couple the plurality of solder interconnects 290 to the substrate 602. Stage 4 may illustrate the package 600 that includes the substrate 602, the integrated device 204 and the integrated device 208. After Stage 4 or before stage 4, an encapsulation layer (e.g., 209) may be formed over the first surface of the substrate 602. The encapsulation layer may encapsulate the integrated device 204. The encapsulation layer 209 may include a mold, a resin and/or an epoxy. The encapsulation layer 209 may be a means for encapsulation. A compression and transfer molding process, a sheet molding process, or a liquid molding process may be used to form the encapsulation layer.

Exemplary Electronic Devices

Figure 10:
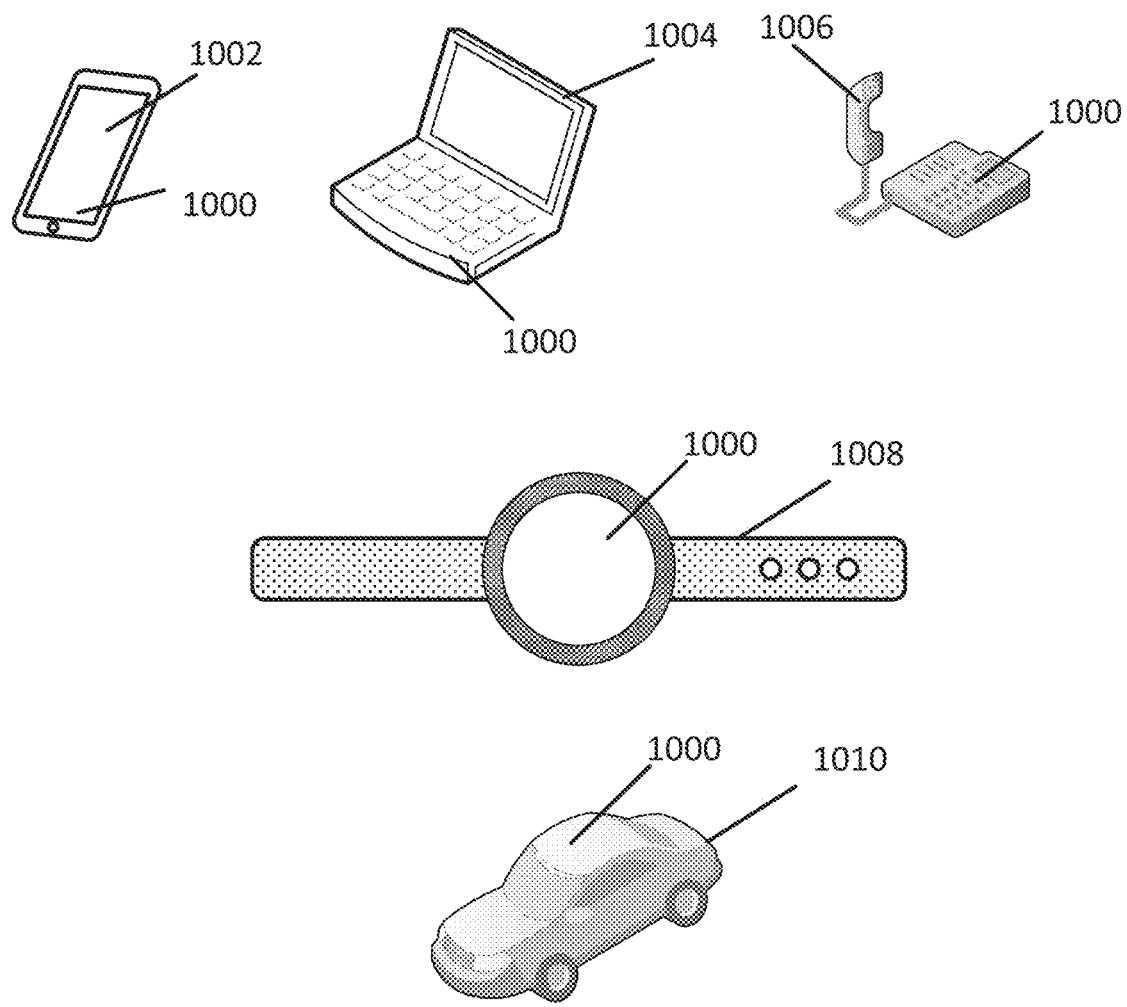
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7F, 8, 9A-9B and/or 10 may be rearranged and/or combined into a single component, process, feature or function or embodied in several components, processes, or functions. Additional elements, components, processes, and/or functions may also be added without departing from the disclosure. It should also be noted FIGS. 2-6, 7A-7F, 8, 9A-9B and/or 10 and its corresponding description in the present disclosure is not limited to dies and/or ICs. In some implementations, FIGS. 2-6, 7A-7F, 8, 9A-9B and/or 10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
    a core layer comprising a first surface and a second surface;
    at least one first dielectric layer located over a first surface of the core layer;
    at least one second dielectric layer located over a second surface of the core layer;
    a plurality of first interconnects located over a surface of the at least one second dielectric layer;
    a plurality of second interconnects located over the surface of the at least one second dielectric layer, wherein the plurality of second interconnects is co-planar to the plurality of first interconnects; and
    a solder resist layer located over the surface of the at least one second dielectric layer,
        wherein the solder resist layer includes a first thickness and a second thickness, and
        wherein a first portion of the solder resist layer that is touching the plurality of first interconnects includes the first thickness that is equal or less than a thickness of the plurality of first interconnects, and
        wherein a second portion of the solder resist layer that is touching the plurality of second interconnects includes the second thickness that is greater than
    a thickness of the plurality of second interconnects, and
an integrated device coupled to the plurality of first interconnects and the plurality of second interconnects of the substrate,
    wherein the integrated device is coupled to the plurality of first interconnects through a plurality of first solder interconnects,
    wherein the integrated device is coupled to the plurality of second interconnects through a plurality of second solder interconnects,
    wherein the integrated device vertically overlaps with (i) a first portion of the substrate that includes the first portion of the solder resist layer and the plurality of first interconnects and (ii) a second portion of the substrate that includes the second portion of the solder resist layer and the plurality of second interconnects, and
    wherein the first portion of the substrate laterally surrounds the second portion of the substrate.

2. The package of claim 1, wherein the first portion of the solder resist layer that is touching the plurality of first interconnects includes a vertical cross section of the solder resist layer that is touching the plurality of first interconnects.

3. The package of claim 1,
    wherein the plurality of first interconnects includes interconnects with (i) a minimum width of 8 micrometers and (ii) a minimum spacing of 10 micrometers, and
    wherein the plurality of second interconnects includes interconnects with (i) a minimum width of 20 micrometers and (ii) a minimum spacing of 25 micrometers.

4. The package of claim 1,
    wherein the plurality of first interconnects includes a first range of surface roughness,
    wherein the plurality of second interconnects includes a second range of surface roughness that is different than the first range of surface roughness,
    wherein the first range of surface roughness does not overlap with the second range of surface roughness,
    wherein the first range of surface roughness includes a first surface roughness, and
    wherein the second range of surface roughness includes a second surface roughness that is greater than the first surface roughness.

5. The package of claim 1, wherein the plurality of first interconnects includes a surface roughness in a range of approximately 0.2-0.5 micrometers.

6. The package of claim 5, wherein the plurality of second interconnects includes a surface roughness in a range of approximately 0.6-0.8 micrometers.

7. The package of claim 1, wherein a first surface of the first portion of the solder resist layer that is touching the plurality of first interconnects is co-planar to a surface of the plurality of first interconnects.

8. The package of claim 1,
    wherein the plurality of first interconnects includes first interconnects with (i) a first minimum width and (ii) a first minimum spacing,
    wherein the plurality of second interconnects includes second interconnects with (i) a second minimum width and (ii) a second minimum spacing,
    wherein the second minimum width is greater than the first minimum width,
    wherein the second minimum spacing is greater than the first minimum spacing,
    wherein the plurality of first interconnects include the first interconnects on a same metal layer of the substrate as the second interconnects from the plurality of second interconnects,
    wherein the first portion of the substrate is an integrated device escape portion of the substrate, and
    wherein the second portion of the substrate is a non-escape portion of the substrate.

9. The package of claim 1,
    wherein the solder resist layer includes the first thickness, the second thickness and a third thickness,
    wherein the first portion of the solder resist layer that is touching the plurality of first interconnects includes the first thickness that is equal to a thickness of the plurality of first interconnects, and
    wherein the first portion of the solder resist layer that is touching the plurality of first interconnects includes the third thickness that is less than the thickness of the plurality of first interconnects.

10. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. An apparatus comprising:
a substrate comprising:
    a core layer comprising a first surface and a second surface;
    at least one first dielectric layer located over a first surface of the core layer;
    at least one second dielectric layer located over a second surface of the core layer;
    means for high-density interconnection located over a surface of the at least one second dielectric layer;
    means for interconnection located over the surface of the at least one second dielectric layer, wherein the means for interconnect is co-planar to the means for high-density interconnection; and a solder resist layer located over the surface of the at least one second dielectric layer,
wherein the solder resist layer includes a first thickness and a second thickness, and
wherein a first portion of the solder resist layer that is touching the means for high-density interconnection includes the first thickness that is equal or less than a thickness of the means for high-density interconnection, and
wherein a second portion of the solder resist layer that is touching the means for interconnection includes the second thickness that is greater than a thickness of the means for interconnection, and an integrated device coupled to a surface of the substrate,
wherein the integrated device is coupled to the means for high-density interconnection and to the means for interconnection through means for solder interconnection,
wherein the integrated device vertically overlaps with (i) an integrated device escape portion of the substrate that includes the first portion of the solder resist layer and the means for high-density interconnection and (ii) a non-escape portion of the substrate that includes the second portion of the solder resist layer and the means for interconnection, and
wherein the integrated device escape portion of the substrate laterally surrounds the non-escape portion of the substrate.

12. The apparatus of claim 11, wherein the first portion of the solder resist layer that is touching the means for high-density interconnection includes a vertical cross section of the solder resist layer that is touching the means for high-density interconnection.

13. The apparatus of claim 11,
wherein the means for high-density interconnection includes interconnects with (i) a minimum width of 8 micrometers and (ii) a minimum spacing of 10 micrometers, and
wherein the means for interconnection includes interconnects with (i) a minimum width of 20 micrometers and (ii) a minimum spacing of 25 micrometers.

14. The apparatus of claim 11,
wherein the means for high-density interconnection includes a first surface roughness, and
wherein the means for interconnection includes a second surface roughness that is greater than the first surface roughness.

15. The apparatus of claim 11,
wherein the means for high-density interconnection includes a surface roughness in a range of approximately 0.2-0.5 micrometers, and
wherein the means for interconnection includes a surface roughness in a range of approximately 0.6-0.8 micrometers.

16. The apparatus of claim 11, wherein a first surface of the first portion of the solder resist layer that is touching the means for high-density interconnection is co-planar to a surface of the means for high-density interconnection.

17. The apparatus of claim 11,
wherein the means for high-density interconnection includes first interconnects located in the integrated device escape portion of the substrate,
wherein the means for interconnection includes second interconnects located in the non-escape portion of the substrate, and
wherein the first interconnects and the second interconnects are located on a same metal layer of the substrate.

18. The apparatus of claim 17,
wherein the escape portion of the substrate vertically overlaps with a periphery of the integrated device coupled to the substrate,
wherein a void is located between the substrate and the integrated device in a region that vertically overlaps with the escape portion,
wherein at least one solder interconnect is coupled to the means for high-density interconnection, and
wherein the at least one solder interconnect is free of laterally touching with the solder resist layer.

19. The apparatus of claim 11,
wherein the means for high-density interconnection includes interconnects with (i) a first minimum width and (ii) a first minimum spacing,
wherein the means for interconnection includes interconnects with (i) a second minimum width and (ii) a second minimum spacing,
wherein the second minimum width is greater than the first minimum width, and
wherein the second minimum spacing is greater than the second minimum spacing.

20. The apparatus of claim 11, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *